(12) United States Patent
Biglarbegian et al.

(10) Patent No.: US 9,947,456 B2
(45) Date of Patent: Apr. 17, 2018

(54) HIGH POWER DENSITY PRINTED CIRCUIT BOARD (PCB) EMBEDDED INDUCTORS

(71) Applicant: The University of North Carolina at Charlotte, Charlotte, NC (US)

(72) Inventors: Mehrdad Biglarbegian, Charlotte, NC (US); Neel Mayur Shah, Lawrence, MA (US); Babak Parkhideh, Charlotte, NC (US)

(73) Assignee: The University of North Carolina at Charlotte, Charlottte, NC (US)

( * ) Notice: Subject to any disclaimer, the term of this patent is extended or adjusted under 35 U.S.C. 154(b) by 0 days.

(21) Appl. No.: 15/359,825

(22) Filed: Nov. 23, 2016

(65) Prior Publication Data
US 2017/0149356 A1 May 25, 2017

Related U.S. Application Data

(60) Provisional application No. 62/259,146, filed on Nov. 24, 2015.

(51) Int. Cl.
*H01F 27/28* (2006.01)
*H02M 1/12* (2006.01)
(Continued)

(52) U.S. Cl.
CPC ........ *H01F 27/2804* (2013.01); *H02M 1/126* (2013.01); *H05K 3/0005* (2013.01); *H02M 7/5387* (2013.01)

(58) Field of Classification Search
CPC .... H02M 7/515; H02M 7/537; H02M 7/5387; H02M 1/126; H03H 1/00; H03H 2001/0092; H05K 3/0005; H01F 27/2804
See application file for complete search history.

(56) References Cited

U.S. PATENT DOCUMENTS

| 6,990,729 B2 * | 1/2006 | Pleskach | H01F 17/0033 156/250 |
| 7,304,558 B1 * | 12/2007 | Pleskach | H01F 17/0033 29/602.1 |

(Continued)

FOREIGN PATENT DOCUMENTS

WO     2016/081473     5/2016

OTHER PUBLICATIONS

Kamby, P.; Knott, A.; Andersen, M.A.E., "Printed circuit board integrated toroidal radio frequency inductors," in IECON 2012—38th Annual Conference on IEEE Industrial Electronics Society, vol., No., pp. 680-684, Oct. 25-28, 2012.

(Continued)

*Primary Examiner* — Matthew Nguyen
(74) *Attorney, Agent, or Firm* — McDonnell Boehnen Hulbert & Berghoff LLP

(57) ABSTRACT

Devices, systems, and methods of manufacture relating to PCB embedded inductors are described in the present disclosure. Namely, an example device includes a substrate having an upper surface and an opposing lower surface. The device also includes a plurality of upper conductors disposed along the upper surface and a plurality of lower conductors disposed along the lower surface. The upper conductors and the lower conductors are radially disposed about a central axis. Each of the upper conductors and the lower conductors includes a petal shape. A distance between adjacent upper conductors is less than a width of each upper conductor and a distance between adjacent lower conductors is less than a width of each lower conductor. The device also includes a plurality of through-substrate conductors connecting respective upper conductors to respective lower conductors so as to form a series electrical connection. The series electrical connection includes a toroid configuration.

20 Claims, 20 Drawing Sheets

(51) Int. Cl.
*H05K 3/00* (2006.01)
*H02M 7/5387* (2007.01)

(56) References Cited

U.S. PATENT DOCUMENTS

| | | | | |
|---|---|---|---|---|
| 2006/0176139 | A1* | 8/2006 | Pleskach | H01F 17/0033 7/33 |
| 2013/0181527 | A1 | 7/2013 | Bhowmik | |
| 2014/0347825 | A1* | 11/2014 | Guo | H01F 5/00 361/748 |
| 2016/0217911 | A1* | 7/2016 | Mano | H01F 27/2804 |
| 2016/0372246 | A1* | 12/2016 | Otsubo | H01F 17/0013 |
| 2017/0213638 | A1* | 7/2017 | Otsubo | H01F 27/2804 |

OTHER PUBLICATIONS

Madsen, M.; Knott, A.; Andersen, M.A.E.; Mynster, A.P., "Printed circuit board embedded inductors for very high frequency Switch-Mode Power Supplies," in ECCE Asia Downunder (ECCE Asia), 2013 IEEE, vol., No., pp. 1071-1078, Jun. 3-6, 2013.

Cheon, S.J.; Park, W.C.; Park, J.Y., "Highly performed PCB embedded inductors using inverted-patterned ground structure," in Microwave Conference (EuMC), 2010 European, vol., No., pp. 312-315, Sep. 28-30, 2010.

Yipeng Su; Qiang Li; Lee, F.C., "Design and Evaluation of a High-Frequency LTCC Inductor Substrate for a Three-Dimensional Integrated DC/DC Converter," in Power Electronics, IEEE Transactions on, vol. 28, No. 9, pp. 4354-4364, Sep. 2013.

Zdanowski, M.; Kostov, K.; Rabkowski, J.; Barlik, R.; Nee, H.-P., "Design and Evaluation of Reduced Self-Capacitance Inductor in DC/DC Converters with Fast-Switching SiC Transistors," in Power Electronics, IEEE Transactions on, vol. 29, No. 5, pp. 2492-2499, May 2014.

Ludwig, M.; Duffy, M.; O'Donnell, T.; McCloskey, P.; Mathuna, S.C.O., "PCB integrated inductors for low power DC/DC converter," in Power Electronics, IEEE Transactions on, vol. 18, No. 4, pp. 937-945, Jul. 2003.

Wei Liang; Glaser, J.; Rivas, J., "13.56 MHz High Density DC-DC Converter With PCB Inductors," in Power Electronics, IEEE Transactions on, vol. 30, No. 8, pp. 4291-4301, Aug. 2015.

Orlandi, S.; Allongue, B.; Blanchot, G.; Buso, S.; Faccio, F.; Fuentes, C.; Kayal, M.; Michelis, S.; Spiazzi, G.,."Optimization of Shielded PCB Air-Core Toroids for High-Efficiency DC-DC Converters," inPower Electronics, IEEE Transactions on, vol. 26, No. 7, pp. 1837-1846, Jul. 2011.

Marxgut, C.; Muhlethaler, J.; Krismer, F.; Kolar, J.W., "Multiobjective Optimization of Ultraflat Magnetic Components With PCB-Integrated Core," in Power Electronics, IEEE Transactions on, vol. 28, No. 7, pp. 3591-3602, Jul. 2013.

Fang Luo; Boroyevich, D.; Mattevelli, P.; Gazel, N., "A comprehensive design for high power density common mode EMI inductor," in Energy Conversion Congress and Exposition (ECCE), 2011 IEEE, vol., No., pp. 1861-1867, Sep. 17-22, 2011.

Schaef, C.; Sullivan, C.R., "Inductor design for low loss with complex waveforms," in Applied Power Electronics conference and Exposition (APEC), 2012 Twenty-Seventh Annual IEEE, vol., No., pp. 1010-1016, Feb. 5-9, 2012.

Fei Wang; Gang Chen; Boroyevich, D.; Ragon, S.; Arpilliere, M.; Stefanovic, V.R., "Analysis and Design Optimization of Diode Front-End Rectifier Passive Components for Voltage Source Inverters," IEEE Transactions in Power Electronics, vol. 23, No. 5, pp. 2278-2289, Sep. 2008.

Su, Y.P.; Xun Liu; Lee, C.K.; Hui, S.Y.R., "Relationship of quality factor and hollow winding structure of Coreless Printed Spiral Winding (CPSW) inductor," in Applied Power Electronics Conference and Exposition (APEC), 2010 Twenty-Fifth Annual IEEE, vol., No., pp. 86-91, Feb. 21-25, 2010.

Sullivan, C.R.; Li, Weidong; Prabhakaran, S.; Shanshan Lu, "Design and Fabrication of Low-Loss Toroidal Air-Core Inductors," in Power Electronics Specialists Conference, 2007. PESC 2007. IEEE, vol., No., pp. 1754-1759, Jun. 17-21, 2007.

D. J. Perreault, J. H. J. Hu, J. M. Rivas, Y. H. Y. Han, O. Leitermann, R. C. N. Pilawa-Podgurski, a. Sagneri, and C. R. Sullivan, "Opportunities and Challenges in Very High Frequency Power Conversion," 2009 Twenty-Fourth Annu. IEEE Appl. Power Electron. Conf. Expo., 2009.

Raymond., L., et al., "27.12 Large Voltage Gain Resonant Converter with Low Voltage Stress," IEEE, p. 1814-1821, 2013.

Suryanarayanan, J., "Design and Fabrication of Toroidal Inductors for Mixed Signal Packaging," A Thesis submitted to the Graduate Faculty of North Carolina State University, Electrical Engineering, 2002).

Han, Y., et al., "Evaluation of Magnetic Materials for Very High Frequency Power Applications," IEEE, p. 4270-4276, 2008.

Qiu, J., "Inductor Design for VHF Tapped-Inductor DC-DC Power Converters," IEEE, p. 142-149, 2011.

Raggl, K., et al., "Comprehensive Design and Optimization of a High-Power-Density Single-Phase Boost PFC," EEE Transaction on Industrial Electronics, Vo. 56, No. 7, p. 2574-2587, 2009.

Biglarbegian, M; Shah,N; Mazhari, I; Parkhideh, B "Temperature rise analysis of high power density/efficient printed circuit board embedded inductor," in press, 3rd IEEE Workshop on Wide Bandgap Power Devices and Applications, Nov. 2015.

Jizheng Qiu; Sullivan, C.R., "Inductor design for VHF tapped-inductor dc-dc power converters," in Applied Power Electronics Conference and Exposition (APEC), IEEE, pp. 142-149, Mar. 6-11, 2011.

Pasterczyk, R.J.; Guichon, J.-M.; Atienza, E., "PWM inverter output filter cost to losses trade off and optimal design," in Applied Power Electronics Conference and Exposition, 2008. APEC 2008. IEEE, pp. 476-482, Feb. 24-28, 2008.

Nam-Ju Park; Dong-Yun Lee; Dong-seok Hyun, "A Power-Control Scheme With Constant Switching Frequency in Class-D Inverter for Induction-Heating Jar Application," in Industrial Electronics, IEEE Transactions, vol. 54, No. 3, pp. 1252-1260, Jun. 2007.

Li, Qingnan; Andersen, M.A.E.; Thomsen, O.C., "Research on Power Factor Correction boost inductor design optimization—Efficiency vs. power density," in Power Electronics and ECCE Asia (ICPE & ECCE), 2011 IEEE, pp. 728-735, May 30, 2011-Jun. 3, 2011.

Shimizu, T.; Kakazu, K.; Takano, K.; Ishii, H., "Loss evaluation of AC filter inductor core on a PWM converter," in Power Electronics and ECCE Asia (ICPE & ECCE), 2011 IEEE, pp. 1047-1052, May 30, 2011-Jun. 3, 2011.

J. Biela, "Wirbelstromverluste in Wicklungen induktiver Bauelemente," Wirbelstromverluste in Wicklungen induktiver Bauelemente, 2012.

* cited by examiner

US 9,947,456 B2

HIGH POWER DENSITY PRINTED CIRCUIT BOARD (PCB) EMBEDDED INDUCTORS

CROSS REFERENCE TO RELATED APPLICATION

The present disclosure claims priority to U.S. provisional patent application No. 62/259,146, filed on Nov. 24, 2015, the entire contents of which are herein incorporated by reference.

BACKGROUND

Unless otherwise indicated herein, the materials described in this section are not prior art to the claims in this application and are not admitted to be prior art by inclusion in this section.

Direct current (DC)-to-alternating current (AC) power inverters may include a passive filtering circuit. The filtering circuit may include an inductor and/or a capacitor (e.g., an LC circuit). Inductors configured for switching operation below 1 MHz may utilize a ferromagnetic or magnetic core. However, power inverters (e.g., GaN switches) operating at higher switching frequencies (e.g., 5-10 MHz), may need smaller inductance values. As such, air-core inductors are feasible for use in conventional power inverters. Among other features, when operated at high frequency, air-core inductors may offer lower cost and higher efficiency as compared to other inductor configurations. Furthermore, printed circuit board (PCB) embedded air-core inductors provide the potential benefit of miniaturization and integration with power electronic circuitry.

Various structures have been proposed for both embedded and non-embedded air-core inductors. For example, solenoid, spiral, and toroidal configurations are the most common inductor structures. Inductors with a toroidal configuration may provide a potential benefit of reduced electromagnetic interference (EMI) as compared to other alternative configurations.

SUMMARY

The present disclosure relates to power inverter devices and systems. In particular, toroidal PCB-embedded air-core inductors are described. Some PCB-embedded inductors may have a toroidal configuration and may be configured to provide high frequency switching operation of power inverter devices. Such inductors may be desirable in utility power electronics applications in order to provide improved efficiency, reduced size, better thermal conduction, higher parameter repeatability, and higher reliability at a reduced cost.

In a first aspect, a device is described. The device includes a substrate having an upper surface and an opposing lower surface and a plurality of upper conductors disposed along the upper surface. The plurality of upper conductors is radially disposed about a central axis and each upper conductor includes a petal shape. A distance between adjacent upper conductors is less than a width of each upper conductor. The device includes a plurality of lower conductors disposed along the lower surface. The plurality of lower conductors is radially disposed about the central axis. Each lower conductor includes a petal shape. A distance between adjacent lower conductors is less than a width of each lower conductor. The device also includes a plurality of through-substrate conductors connecting respective upper conductors to respective lower conductors so as to form a series electrical connection. The series electrical connection comprises a toroid configuration.

In a second aspect, a system is described. The system includes a DC source input and a switching circuit coupled to the DC source input. The system also includes a filtering circuit coupled to the switching circuit. The filtering circuit includes an inductor. The inductor includes a substrate having an upper surface and an opposing lower surface and a plurality of upper conductors disposed along the upper surface. The plurality of upper conductors is radially disposed about a central axis. Each upper conductor comprises a petal shape. A distance between adjacent upper conductors is less than a width of each upper conductor. The system also includes a plurality of lower conductors disposed along the lower surface. The plurality of lower conductors is radially disposed about the central axis. Each lower conductor includes a petal shape. A distance between adjacent lower conductors is less than a width of each lower conductor. The system additionally includes a plurality of through-substrate conductors connecting respective upper conductors to respective lower conductors so as to form a series electrical connection. The series electrical connection includes a toroid configuration. The system yet further includes an output circuit coupled to the filtering circuit.

In a third aspect, a method for designing a PCB-embedded inductor is described. The method includes adjusting an outer diameter of the inductor and a number of turns of the inductor based on predetermined physical constraints and predetermined performance specifications. The inductor includes a plurality of upper conductors disposed along an upper surface of a substrate. The plurality of upper conductors is radial disposed about a central axis. Each upper conductor has a petal shape. A trace clearance between adjacent upper conductors is less than a width of each upper conductor. The substrate includes a printed circuit board (PCB). The inductor also includes a plurality of lower conductors disposed along a lower surface of the substrate. The lower substrate is disposed opposite the upper surface. The plurality of lower conductors is radially disposed about the central axis. Each lower conductor includes a petal shape. A trace clearance between adjacent lower conductors is less than a width of each lower conductor. The inductor also includes a plurality of through-substrate conductors connecting respective upper conductors to respective lower conductors so as to form a series electrical connection. The series electrical connection includes a toroid configuration. The toroid configuration includes a plurality of turns about a reference circle that is defined along a reference plane between the upper surface and the lower surface. The method includes, subsequent to adjusting the outer diameter and the number of turns, determining whether an inductance of the inductor is greater than a threshold inductance value. The method yet further includes adjusting the trace clearance. The trace clearance comprises a distance between adjacent conductors. The method also includes subsequent to adjusting the trace clearance, determining whether an inductance of the inductor is greater than a threshold inductance value. The method includes adjusting a thickness of at least one of the upper conductor or the lower conductor. The method yet further includes adjusting a diameter of the through-substrate conductors. The method additionally includes adjusting a number of through-substrate conductors. The method also includes determining a plurality of device performance metrics, based on the adjusted attributes of the inductor. The method also includes determining, based on the device performance metrics being above a plurality of device requirements, that the inductor should be fabricated. The method also includes fabricating the inductor according to the adjusted attributes.

Other aspects, embodiments, and implementations will become apparent to those of ordinary skill in the art by reading the following detailed description, with reference where appropriate to the accompanying drawings.

DETAILED DESCRIPTION

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

As recited herein, the term "substantially" or "about" is meant to describe that a characteristic, parameter, or value need not be achieved exactly, but that deviations or variations, including for example, tolerances, measurement error, measurement accuracy limitations and other factors known to skill in the art, may occur in amounts that do not preclude the effect the characteristic was intended to provide. For example, about 3000 $mm^2$ may include a range of areas with a tolerance of 5% or within a range of 2850-3150 $mm^2$. As such, values expressly described herein may also include reference to substantially similar values corresponding to tolerance ranges of 1%, 3%, 5%, 10%, or another tolerance range.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

Devices, systems, and methods of manufacture relating to PCB embedded inductors are described in the present disclosure. The PCB embedded inductor includes a toroidal configuration and a dual-plane arrangement of metal layers that are electrically coupled by a plurality of through substrate vias. The devices and systems described herein may provide high efficiency (more than 98%) for high frequency inverter applications. Such inverter devices and systems may be used for PV applications. In an example embodiment, an inverter may include a rated power of 280 W with an input of 18 A and an output of 31.2V-DC voltage, 9.07 A-DC current.

II. Example Devices

Figure 1A:
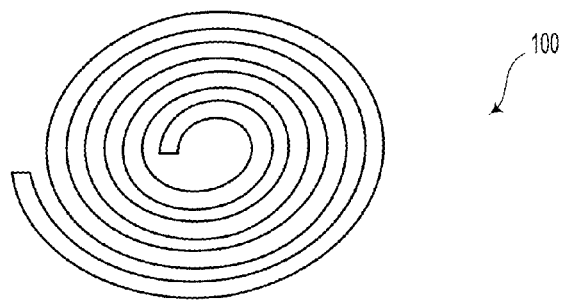
FIG. 1A illustrates a device geometry.
Figure 1B:
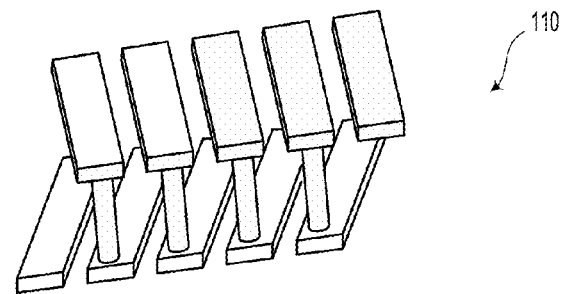
FIG. 1B illustrates a device geometry.
Figure 1C:
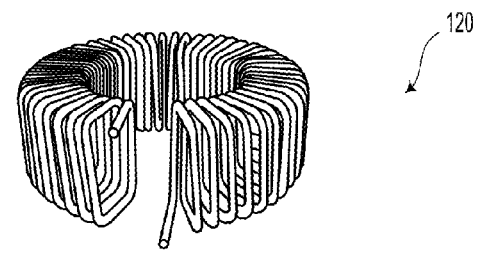
FIG. 1C illustrates a device geometry.

FIGS. 1A, 1B, and 1C illustrate several possible device geometries for inductors. FIG. 1A illustrates a first device geometry of an inductor. As illustrated in FIG. 1A, the inductor may include spiral configuration 100. FIG. 1B illustrates a second possible device geometry of an inductor. As illustrated, the inductor may include solenoid configuration 110. FIG. 1C illustrates a third possible device geometry 120 of an inductor. As illustrated, the inductor may include toroid configuration 120.

The spiral 100 and solenoid 110 configurations may provide straight-forward implementation with printed circuit board (PCB) technologies and may provide higher inductance values compared to the toroid configuration 120. However, the toroid configuration 120 may be less susceptible to electromagnetic interference as compared to other inductor configurations. For example, the toroidal configuration 120 may provide internal encapsulation of the magnetic field in the inductor device.

Conventional switch mode power supplies (SMPSs) combine RF circuits and power electronics operable at switching frequencies between 30-300 MHz (e.g., for use in resonant DC/DC converters). However, the present disclosure relates to toroidal PCB-embedded inductors suitable for smoothing the AC current of hard-switched inverters operating within a switching frequency range of about 1 to 10 MHz.

Figure 2A:
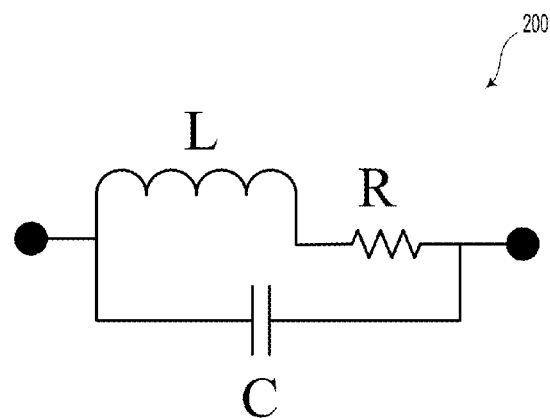
FIG. 2A illustrates a filtering circuit, according to an example embodiment.

FIG. 2A illustrates a filtering circuit 200, according to an example embodiment. Such a filtering circuit 200 may be incorporated into a hard-switched inverter as described above. FIG. 2A may illustrate actual electronic components (e.g., a resistor, a capacitor, and an inductor). Alternatively, FIG. 2A may illustrate an equivalent circuit (e.g., an equivalent resistance, an equivalent capacitance, and an equivalent inductor. Parasitic capacitance, inductance, and resistance values may also be represented and/or accounted for in such a circuit.

Figure 2B:
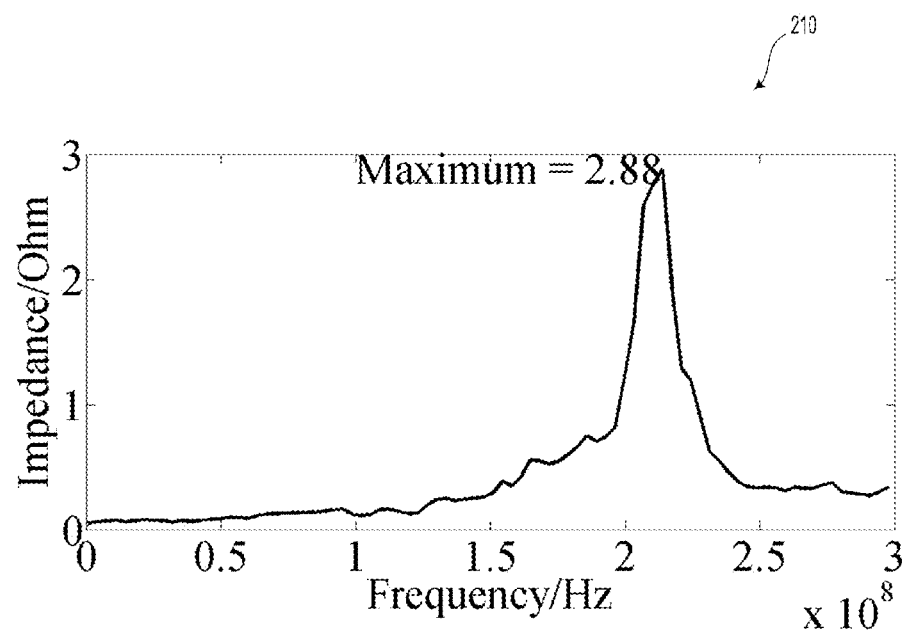
FIG. 2B illustrates an impedance versus frequency graph, according to an example embodiment.

FIG. 2B illustrates an impedance versus frequency graph 210, according to an example embodiment. The graph 210 illustrates behavior of an example filtering circuit over a wide range of frequencies using a spectrum analyzer. The example filtering circuit may have a characteristic resonance at approximately 280 MHz. However, other resonant frequencies are possible. A resonant frequency of the filtering circuit may be based, at least in part, on the inductance and the capacitance of conductors and vias.

To design a filtering circuit (e.g., filtering circuit 200) to smooth the AC current of a hard-switched inverter, a cutoff frequency of the filtering circuit may be selected. In some embodiments, the cutoff frequency may be approximately ¹⁄₁₀ the switching frequency of the inverter. For a parallel LC circuit, $$f_{cutoff} = \frac{1}{2\pi\sqrt{L_{min}C_{min}}} = \frac{1}{\sqrt{\frac{4\pi^2(V_{in}-V_{out})D_{max}}{\Delta I \times f_{sw}} \times \frac{\Delta ID_{max}}{f_{sw}\Delta V}}}$$

where $V_{in}$ is the input voltage, $V_{out}$ is the output voltage, $D_{max}$ is the maximum duty cycle of an input signal, $f_{sw}$ is the switching frequency of the inverter, and $f_{cutoff}$ is the cutoff frequency of the LC circuit. Accordingly, for a given switching frequency, an appropriate value for the inductance of a LC circuit may be expressed as:

$$L = \frac{(V_{in}-V_{out})D_{max}^2}{\Delta V \times f_{sw}^2 \times C}$$

Figure 2C:
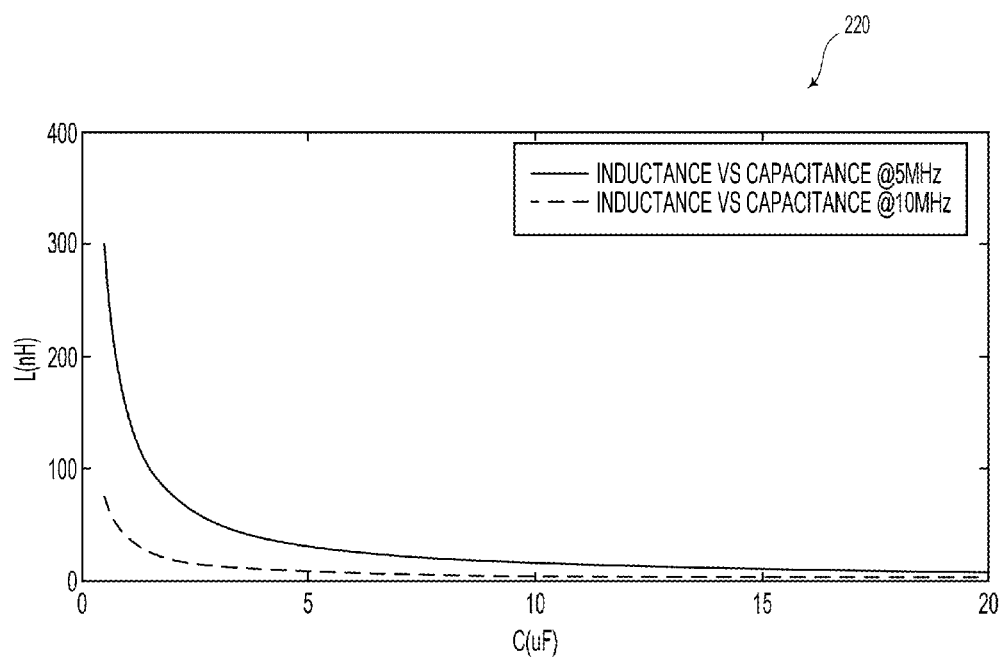
FIG. 2C illustrates an inductance versus capacitance graph, according to example embodiments.

FIG. 2C illustrates an inductance versus capacitance graph 220, according to example embodiments. Namely, FIG. 2C illustrates corresponding inductance and capacitance values appropriate for filtering circuits in full bridge inverter circuits operating at 5 MHz and 10 MHz switching frequencies. Within the context of the present disclosure, FIG. 2C may provide design parameters for components of the filtering circuits, including appropriate inductance values for the design of inductor devices described herein. In example embodiments, in order to reduce or eliminate the need for large capacitance values (and correspondingly large passive devices) in the filtering circuit, inductance values between 30-500 nanoHenries (nH) may be considered. In some embodiments, a low-loss ceramic capacitor may be provided in the filter circuit. In such scenarios, the capacitor may have a capacitance value of 1-2 μF.

Figure 2D:
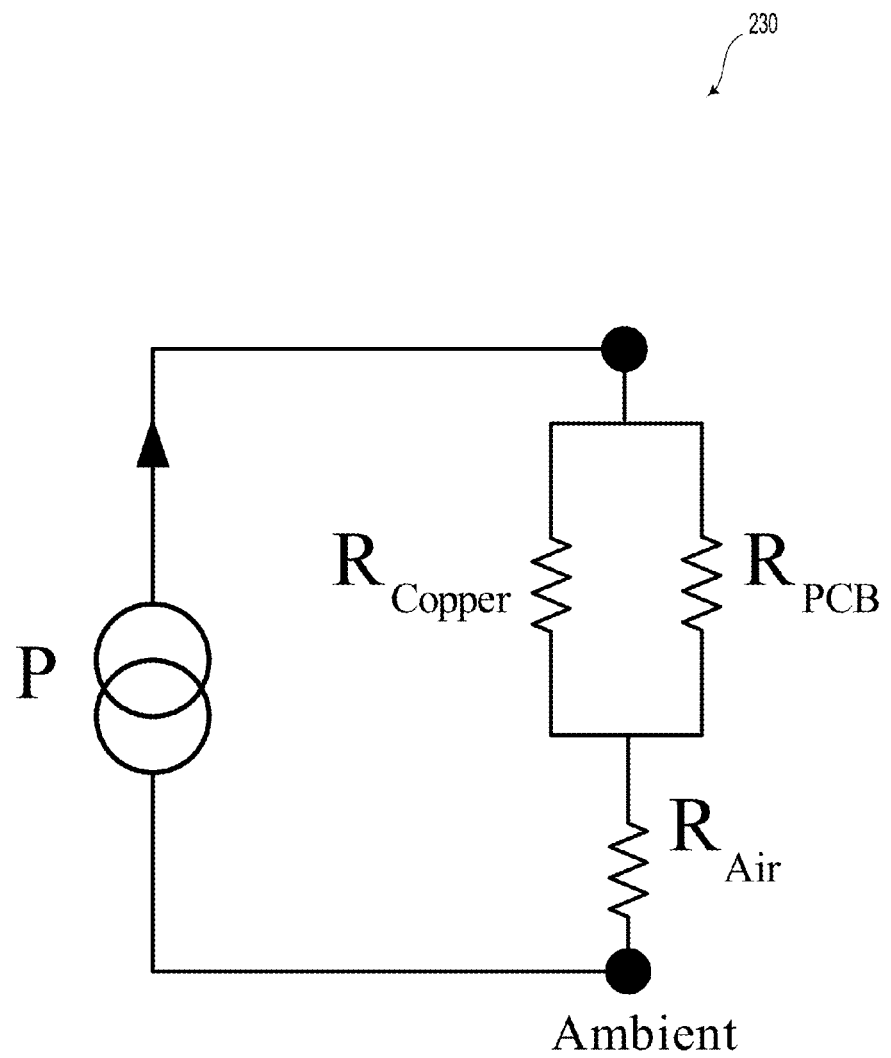
FIG. 2D illustrates an equivalent thermal circuit model, according to example embodiments.

FIG. 2D illustrates an equivalent thermal circuit model 230, according to example embodiments. The equivalent thermal circuit model 230 may include a thermal resistivity of copper ($R_{Copper}$), the thermal resistivity of the printed circuit board ($R_{PCB}$), and the thermal resistivity of air ($R_{Air}$). As described elsewhere herein, temperature rise under normal operating conditions may be quantified using thermal circuit model 230.

Figure 3A:
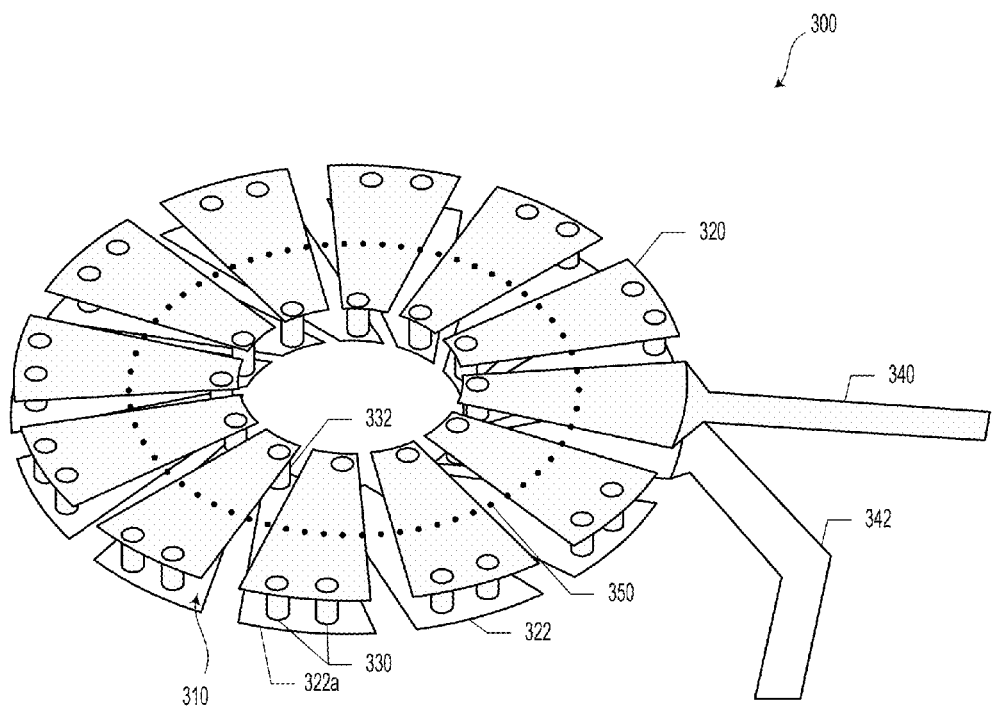
FIG. 3A illustrates a device, according to an example embodiment.

FIG. 3A illustrates a device 300, according to an example embodiment. Device 300 includes a substrate 310 (illustrated herein as being transparent for clarity) having an upper surface and an opposing lower surface. For example, the substrate 310 could include a printed circuit board material, such as FR-4 or another type of resin-epoxy composite material. The upper surface of the substrate 310 could be a top (outer surface) of the substrate 310. Alternatively, the upper surface of the substrate 310 could be a layer of substrate 310 that is positioned above the lower surface. Likewise, the lower surface could be a bottom surface of the substrate 310 or a layer of the substrate 310 that is positioned below the upper surface. The device 300 may be formed using a two-layer copper PCB. Other types of substrate materials are possible.

The device 300 also includes a plurality of upper conductors 320. The upper conductors 320 are disposed along the upper surface of the substrate 310. In some embodiments, the upper conductors 320 may be disposed on a top surface of a printed circuit board. The plurality of upper conductors 320 is radially disposed about a central axis. That is, as illustrated in FIG. 3A, the central axis may pass through an open middle portion of the device 300. In such a scenario, the upper conductors 320 may be arranged in a rotationally-symmetric arrangement. Additionally or alternatively, the upper conductors 320 may be arranged about the central axis at a minimum radius setback. That is, an inner edge of the respective upper conductor 320 may be disposed along the upper surface at a distance away from the central axis that corresponds to the minimum radius setback. As a further alternative, the upper conductors 320 may be arranged such that an outer edge of the respective upper conductor 320 may be disposed at a maximum radius setback from the central axis.

Each upper conductor 320 may be shaped in a petal shape. For example, each upper conductor 320 may have an inner edge located closest to the central axis and an outer edge located away from the central axis. In such a scenario, the inner edge could be narrower than the outer edge. Put another way, the petal shape could be indicative of a width along an outer perimeter of a given upper conductor 320 that is larger than a width along an inner perimeter of the given upper conductor 320. Yet further, the petal shape could include the plurality of upper conductors 320 appearing like petals of a blooming flower (e.g., a daisy or sunflower). Furthermore, a distance between adjacent upper conductors may be less than a width of each upper conductor 320. That is, the upper conductors 320 could be shaped, arranged, and/or spaced such that a space between adjacent upper conductors 320 may be narrower compared to the width of each upper conductor 320. It will be understood that in some scenarios, the upper conductors 320 need not be shaped identically and that minor deviations in shape are possible between the respective upper conductors 320.

The device 300 also includes a plurality of lower conductors 322. The lower conductors 322 are disposed along the lower surface of the substrate 310. For example, in some embodiments, the lower surface of the substrate 310 may include a bottom surface of a printed circuit board. The plurality of lower conductors 322 is radially disposed about the central axis. In some embodiments, the plurality of lower conductors 322 may be arranged such that they are aligned with portions of the upper conductors 320. That is, the plurality of lower conductors 322 may be disposed such that an inner portion of a given upper conductor 320 overlaps an inner portion of a first lower conductor 322 while an outer portion of the given upper conductor 320 overlaps an outer portion of a second lower conductor 322.

Each lower conductor 322 may be shaped in a petal shape. For example, each lower conductor 322 may have an inner edge located closest to the central axis and an outer edge located away from the central axis. In such a scenario, the inner edge could be narrower than the outer edge. As described with regard to the upper conductors 320, the petal shape could be indicative of a width along an outer perimeter of a given lower conductor 322 that is larger than a width along an inner perimeter of the given lower conductor 322. Furthermore, the petal shape could include the plurality of lower conductors 322 appearing like petals of a blooming flower (e.g., a daisy or sunflower). Additionally, a distance between adjacent lower conductors may be less than a width of each lower conductor 322. That is, the lower conductors 322 could be shaped, arranged, and/or spaced such that a space between adjacent lower conductors 322 may be less than the width of each lower conductor 322.

The device 300 also include a plurality of through-substrate conductors 330 and 332 connecting respective upper conductors to respective lower conductors so as to form a series electrical connection. The through-substrate conductors 330 and 332 may be conductive vias configured to electrically couple a given upper conductor to a lower conductor. In some embodiments, each upper conductor may include one or more inner through-substrate conductors 332 and one or more outer through-substrate conductors 330. As illustrated in FIG. 3A, a given lower conductor (e.g., lower conductor 332a) may be connected to two different upper conductors so as to form a series electrical connection. That is, upper and lower conductors may be connected in a series clockwise or counter-clockwise arrangement. In such a manner, the series electrical connection may include a toroid configuration.

Put another way, the toroid configuration of device 300 may include a plurality of turns of a conductor about a reference circle 350 that is defined along a reference plane between the upper surface and the lower surface. As such, device 300 may represent a way to form a toroid inductor (e.g., toroid 120) using printed circuit board technology.

The device 300 may include an input leg 340 and an output leg 342. Current may enter device 300 via the input leg 340 be circulated through the through-substrate conductors and petal conductors (e.g., the plurality of upper conductors and lower conductors) and exit the device 300 via the output leg 342. It will be understood that input leg 340 and output leg 342 may additionally or alternatively be connected to an AC signal, in which case, current may flow in alternating directions within the device 300.

The inductance of a toroidal PCB embedded inductor may be calculated by:

$$L = \frac{N^2 h \mu_0}{2\pi} \ln\left(\frac{d_o}{d_i}\right) + \frac{d_o + d_i}{4} \mu_0 \left[\ln\left(8\frac{d_o + d_i}{d_o - d_i}\right) - 2\right],$$

wherein N is the number of turns, h is the height of the inductor (e.g., the PCB thickness), and $\mu_0$ is the permeability of air. Furthermore, $d_i$ and $d_o$ are the inner and outer diameters of the toroidal inductor, respectively.

In some embodiments, the inductance may be expressed in the simplified form:

$$L \propto \mu_0 k N^2 h,$$

where k is a constant value for defined outer/inner inductor geometries.

Although miniaturizing inductor components may provide higher power density, increased resistance may provide unwanted effects such as copper conduction losses. The resistance of device 300 may include two parts: resistance of the petals (e.g., the upper and lower conductors) and the resistance of the vias (e.g., the through-substrate conductors). In an example embodiment, the resistance of device 300 may be expressed as:

$$R = N\left(2 \times R_{petal} + \frac{R_{inner\_via}}{N_{inner}} + \frac{R_{outer\_via}}{N_{outer}}\right),$$

The resistance of each petal is proportional to the copper resistivity, number of turns, and outer diameter of the inductor, and it is inversely related to the skin depth, petals' clearance (e.g., the distance between adjacent conductors) and inner diameter of the vias. Via resistance will scale directly with copper resistivity and inversely with the via diameter and the skin depth, which is a measure of the penetration of a plane electromagnetic wave into the copper. By considering the impact of skin and proximity effects on the total resistance of the vias, the current tends to pass through the edges of the conductor (copper) as the current density is largest near the surface. Also, proximity effect due to the relatively bigger size of each petal with respect to their clearance can be ignored. In an embodiment, the resistance of device 300 with an alternating signal may be expressed as:

$$R_{ac} = \frac{N^2}{G_0 - N(\beta - 1)\delta l},$$

where $G_0$ is the global conductivity, l is the average length of the current path, and $\delta$ is the skin depth of the conductive material (e.g., copper) in the inductor. By simplifying the equation and applying the skin effect relation with switching frequency, the AC resistance can be expressed as:

$$R_{ac} \propto k_1 N^2 \sqrt{f},$$

where $k_1$ is a constant factor that depends on the geometry of the inductor.

In some embodiments, JMAG finite element analysis (FEA) simulations may be conducted to predict the thermal and electrical properties for various inductor designs. The various inductor designs may include varying numbers and size of the through-substrate conductors.

In some embodiments, a thickness of the substrate 310 may be less than about 1.6 millimeters. In other embodiments, the thickness of the substrate 310 may be in the range of 0.5 millimeters to 2 millimeters. Alternatively, the thickness of substrate 310 may be another value.

In an example embodiment, a diameter of the device 300 may be less than about 60 millimeters. For instance, an outer diameter of device 300 (e.g., corresponding to an outer edge of the upper and/or lower conductors) may be approximately 30 millimeters. It will be understood that other values for the diameter of device 300 may be possible.

In example embodiments, an area of the device 300 may be less than about 3000 mm². For example, the area of device 300 may be approximately 900 mm². It is understood that other values for the area of device 300 are possible and contemplated herein.

In some embodiments, device 300 may include more or fewer turns. For example, the plurality of turns may be 8, 13, or 26. In some examples, the plurality of turns may be less than 50, and more than 4. Other examples are possible as well. In some cases, the plurality of turns may directly affect the inductance of device 300. That is, all other parameters being equal, as the number of turns increases, the inductance of device 300 will increase. For example, as described herein, an 8-turn inductor device may have an inductance of 50 nH and a 26-turn inductor device may have an inductance of 242 nH. As such, the number of upper conductors and/or the number of lower conductors may vary based on, for example, a desired inductance value.

Inductance values of devices disclosed herein may be between about 45 and 305 nanoHenries. In an example embodiment, a desired inductance value may be approximately 50 nH. However, other values of inductance are possible and contemplated.

In some embodiments, a resistance of the device 300 may be less than about 2.6 milliOhms at DC and less than about 9 milliOhms for 1 MHz signal. For example, in the case of an 8-turn inductor device, the resistance may be approximately 2.4 mOhms. Resistance values will vary based on, among other aspects, the number of turns of device 300.

In an example embodiment, a quality factor of the device 300 may be at least 300, however other values for the quality factor are possible.

As described throughout the present disclosure, three inductor designs were modeled, built and tested, as described in Table I, to illustrate various parameters and configurations of the device that result in those parameters.

TABLE I

Physical Parameters of PCB Inductor Designs

| Parameters | Design 1 | Design 2 | Design 3 | Units |
|---|---|---|---|---|
| Inductance | 242 | 150 | 50 | nH |
| Number of Turns | 26 | 13 | 8 | — |
| Outer Diameter | 60 | 60 | 30 | mm |
| Inner Diameter | 20 | 20 | 15 | mm |
| DC Resistance | 160 | 32 | 2.4 | mΩ |
| AC Resistance | 200 | 50 | 8 | mΩ |
| Via Diameter | 1 | 2 | 2.8 | mm |
| Height | 1.5 | 3.5 | 3.5 | mm |

TABLE II

Physical Parameters of PCB Inductor Designs at 1 MHz

| Frequency-1 MHz | Design1 | Design2 | Design 3 | Units |
|---|---|---|---|---|
| 1-Oz | 149.8 | 29.5 | 5.2 | mΩ |
| 2-Oz | 69.5 | 15 | 2.7 | mΩ |
| 4-Oz | 39.5 | 7.8 | 3 | mΩ |
| 6-Oz | 27.9 | 5.6 | 2.1 | mΩ |

TABLE III

Physical Parameters of PCB Inductor Designs at 10 MHz

| Frequency-10 MHz | Design1 | Design2 | Design 3 | Units |
|---|---|---|---|---|
| 1-Oz | 208.5 | 57.6 | 26.7 | mΩ |
| 2-Oz | 108 | 28.1 | 14.5 | mΩ |
| 4-Oz | 60.1 | 14.6 | 7.9 | mΩ |
| 6-Oz | 46.1 | 11 | 5.9 | mΩ |

Tables II and III illustrate the effects of copper conductor thickness on AC resistance for each of the three designs at 1 MHz and 10 MHz, respectively.

Figure 3B:
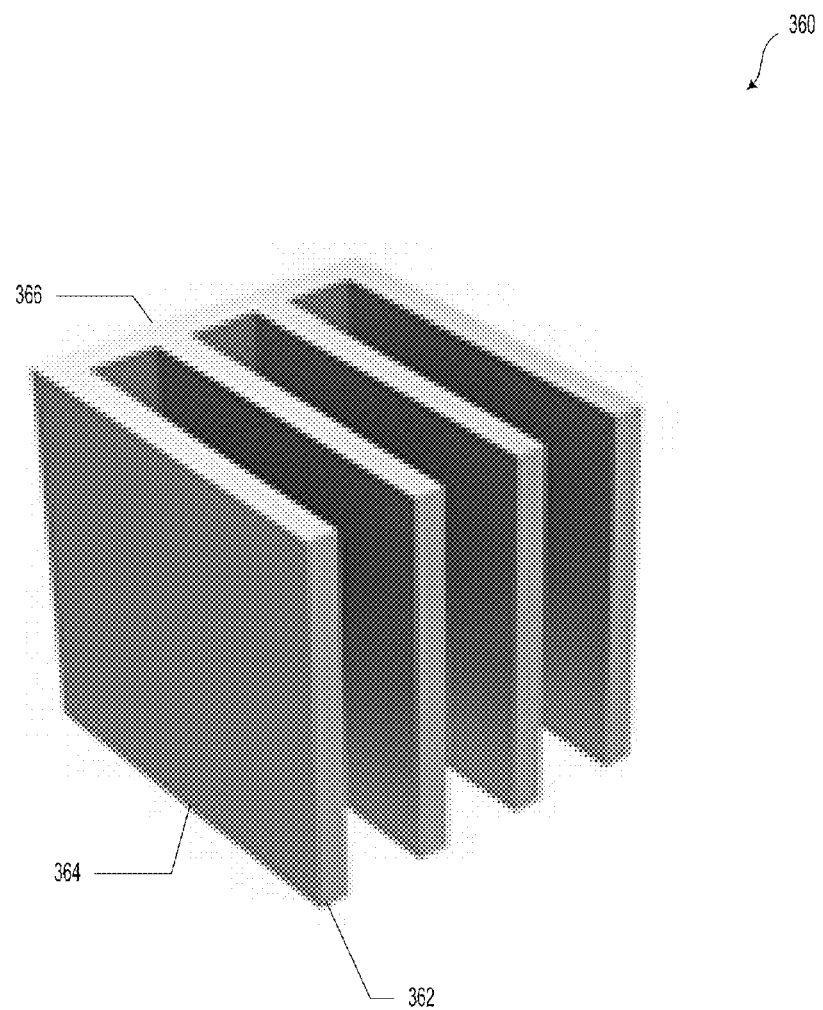
FIG. 3B illustrates a heat sink, according to an example embodiment.

FIG. 3B illustrates a heat sink 360, according to an example embodiment. In some embodiments, device 300 may also include a heat sink 360 coupled to at least one of the upper surface or at least one of the upper conductors 320. The heat sink 360 may be coupled to the upper surface or the upper conductors 320 by a base portion 366. For example, the base portion 366 may be clamped, glued, or otherwise fastened to the upper surface or the upper conductors 320. Furthermore, when coupled, the base portion 366 may include thermal paste or another thermally conductive material so as to efficiently conduct heat away from the upper surface and/or other portions of device 300. The heat sink 360 may include cooling fins 362 configured to dissipate heat over a fin area 364. The heat sink 360 may dissipate heat via, for example, thermal conduction and thermal convection.

The total thermal resistance of a device 300 and a heat sink 360 may be expressed as:

$$R_{th\_heatsink} = \frac{1}{h(A_{heatsink} + \eta N_{fin} A_{fin})},$$

where h is the convective heat transfer coefficient, $A_{heatsink}$ is the area of the base portion 366, $A_{fin}$ is the surface area of the fins (e.g., fin area 364), and $N_{fin}$ is the total number of cooling fins 362 in the heat sink 360. The total thermal resistivity of the PCB-embedded inductor may be expressed as:

$$R_{th\_total} = R_{th\_heatsink} + (R_{th\_PCB} \| R_{th\_copper}), \text{ where}$$

$$R_{th\_PCB} = \frac{1}{h_{PCB} A_{inductor}}$$

According to the above equations, the addition of a heat sink in device 300 may provide some design and performance benefits. For example, keeping a temperature rise value constant (e.g., 45° C.), an inductor diameter may be reduced from 60 mm to 39 mm for the 26-turn and the 13-turn inductor designs, respectively. Furthermore, again keeping temperature rise constant, the inductor diameter may be decreased from 30 mm to 25 mm for the 8-turn inductor design. As a result of decreasing the inductor diameter, the total resistance of the PCB-embedded inductor will be decreased by 20% for the 26-turn and 13-turn inductors and 10% for the 8-turn inductor, resulting in higher efficiency.

Figure 4A:
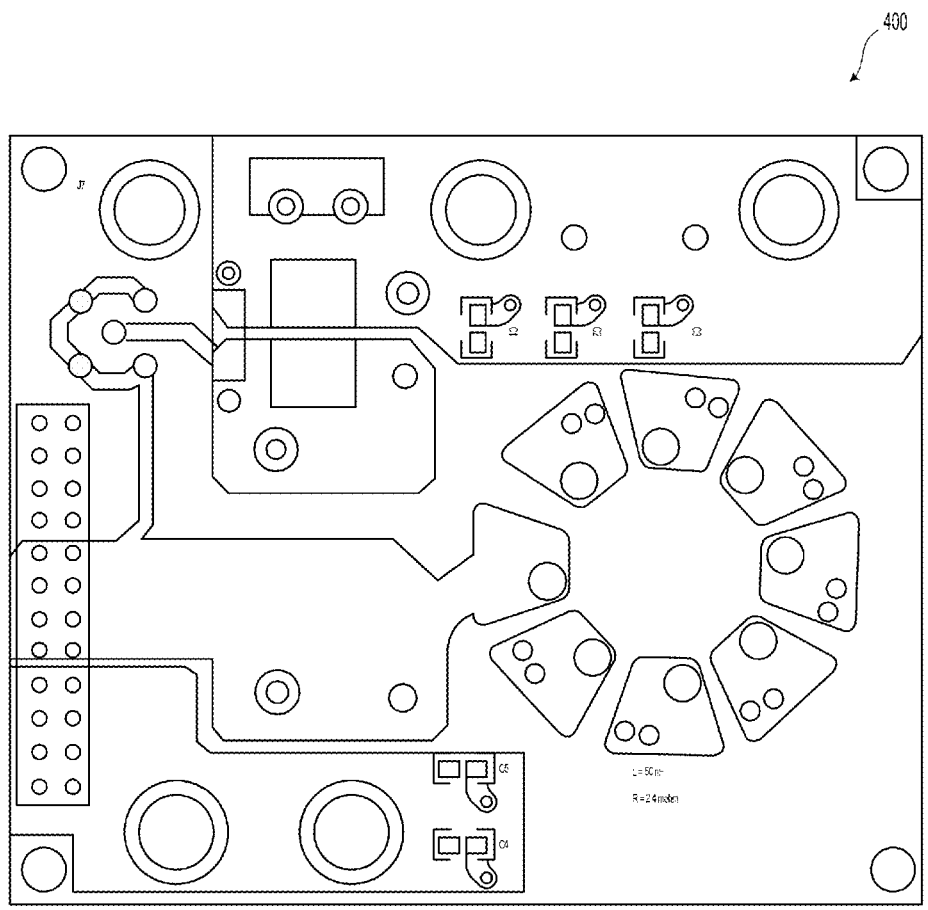
FIG. 4A illustrates a device, according to an example embodiment.

FIG. 4A illustrates a device 400, according to an example embodiment. Device 400 illustrates a variation of device 300 that includes 8-turns (e.g., Design 3 from Table I). That is, the series electrical connection of device 400 includes a toroid configuration with 8 turns about the reference circle 350. Device 400 may have a diameter of approximately 30 mm.

Figure 4B:
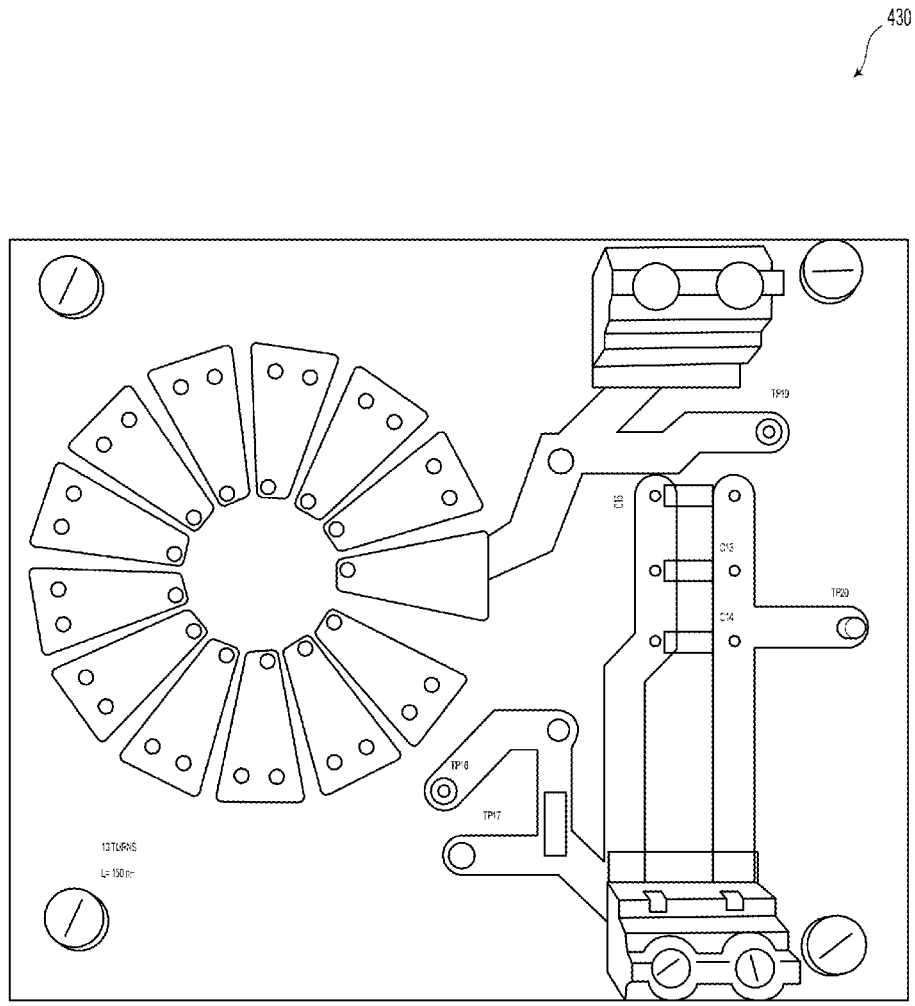
FIG. 4B illustrates a device, according to an example embodiment.

FIG. 4B illustrates a device 430, according to an example embodiment. Device 430 illustrates a variation of device 300 that includes 13-turns (e.g., Design 2 from Table I). That is, the series electrical connection of device 430 includes a toroid configuration with 13 turns about the reference circle 350. Device 430 may have a diameter of approximately 60 mm.

Figure 4C:
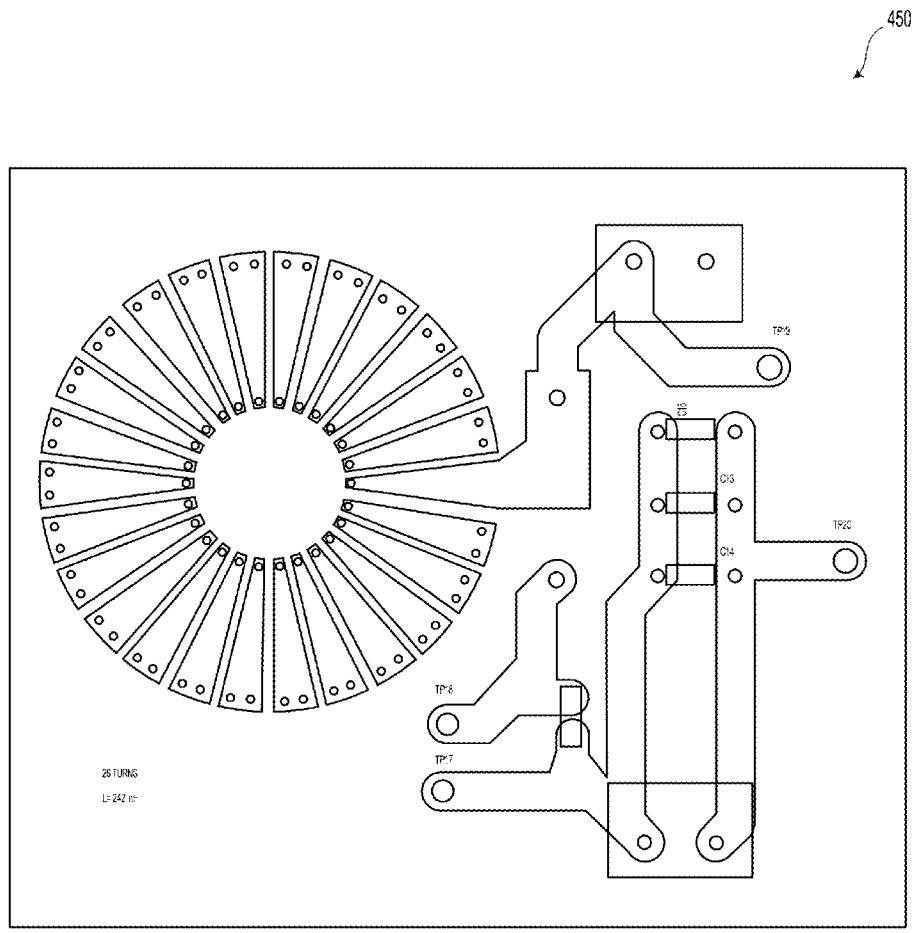
FIG. 4C illustrates a device, according to an example embodiment.

FIG. 4C illustrates a device 450, according to an example embodiment. Device 450 illustrates a variation of device 300 that includes 26-turns (e.g., Design 1 from Table I). That is, the series electrical connection of device 450 includes a toroid configuration with 26 turns about the reference circle 350. Device 450 may have a diameter of approximately 60 mm.

Figure 5:
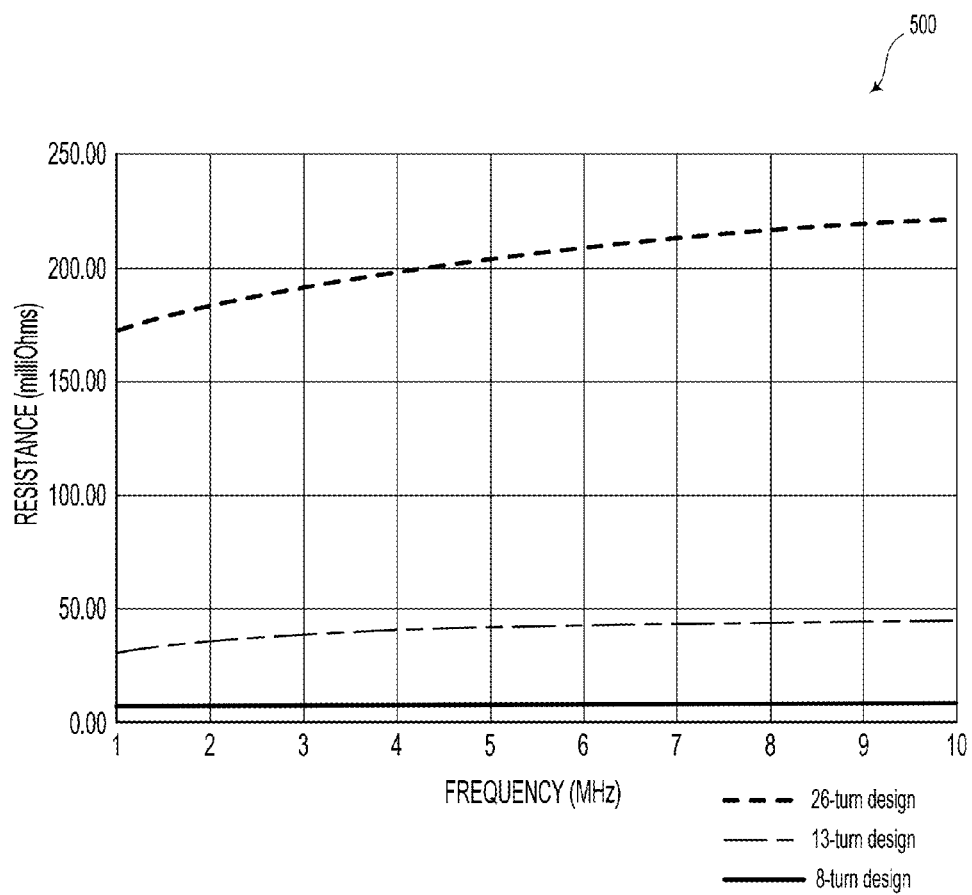
FIG. 5 illustrates a resistance versus frequency graph, according to example embodiments.
Figure 6:
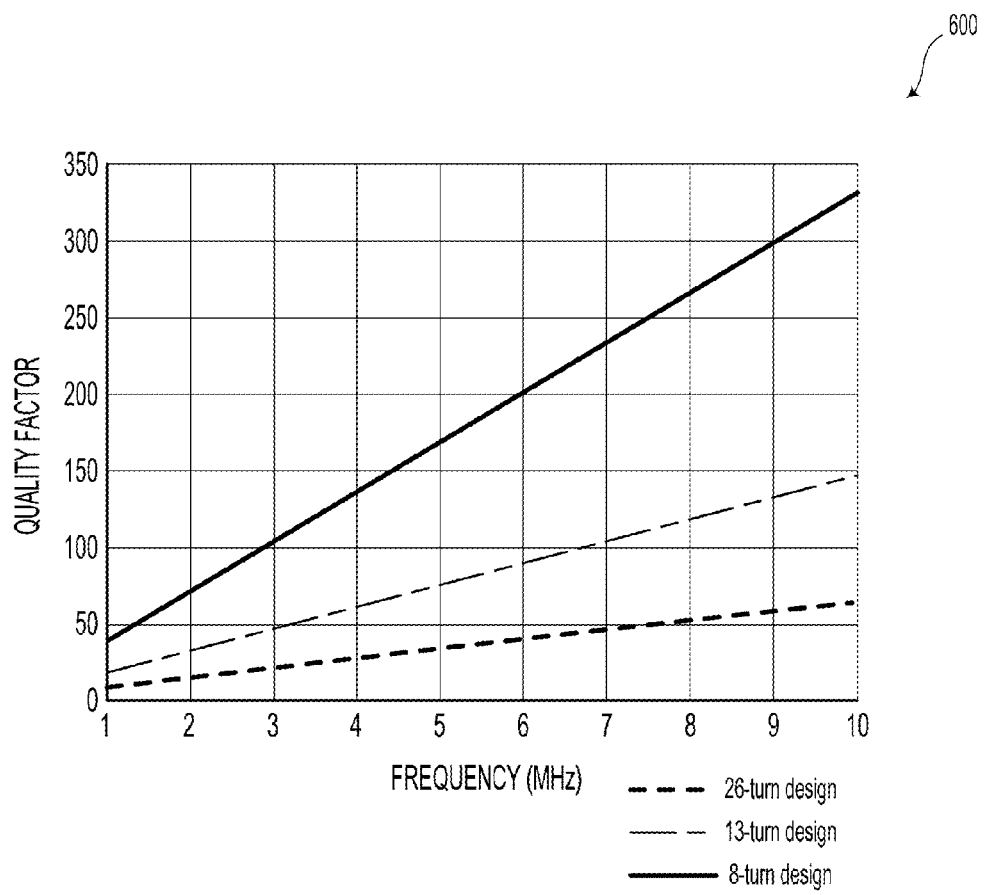
FIG. 6 illustrates a quality factor versus frequency graph, according to example embodiments.
Figure 7:
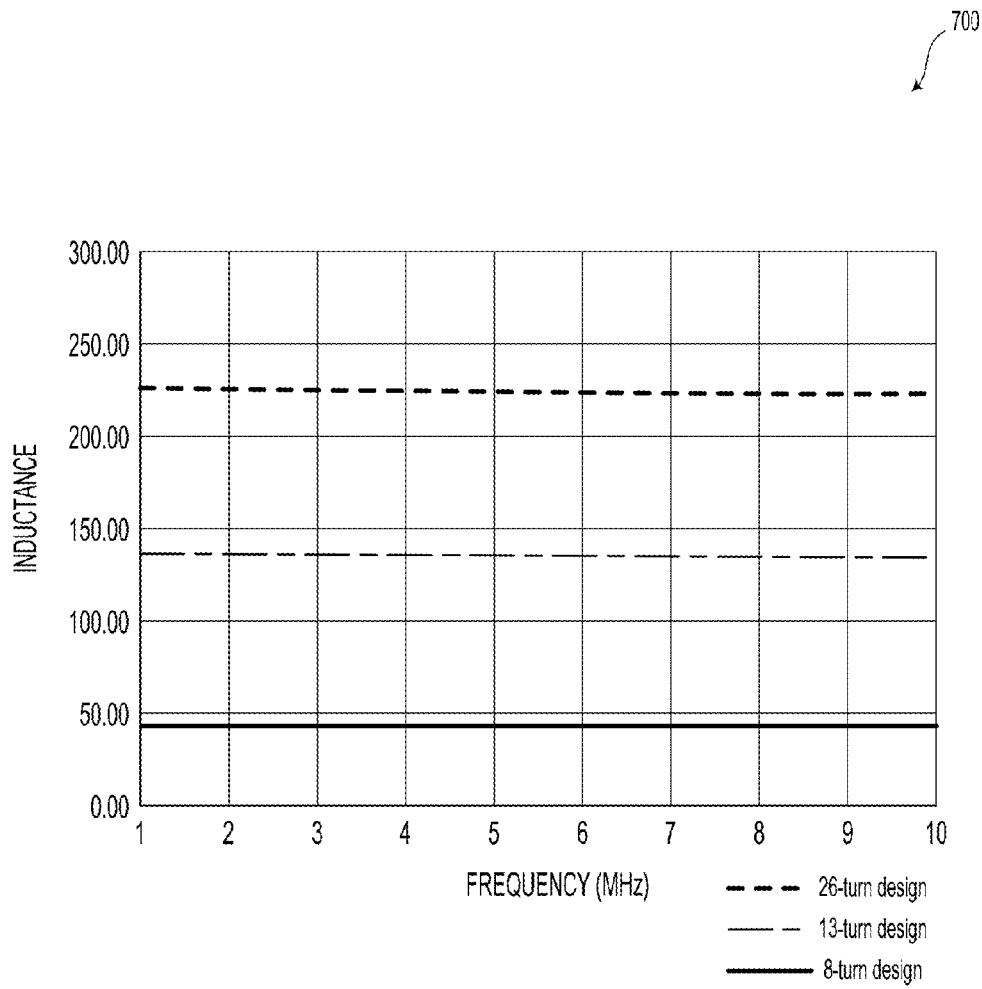
FIG. 7 illustrates an inductance versus frequency graph, according to example embodiments.

FIGS. 5, 6, and 7 include results from several finite element analysis simulations performed on each of the PCB-embedded inductor designs described in Table I. FIG. 5 illustrates a resistance versus frequency graph 500, according to example embodiments. Namely, FIG. 5 illustrates the resistance of 8-turn, 13-turn, and 26-turn designs with respect to signals with frequencies between 1 to 10 MHz, based on finite element analysis simulations.

FIG. 6 illustrates a quality factor versus frequency graph 600, according to example embodiments. Specifically, FIG. 6 illustrates the quality factor of 8-turn, 13-turn, and 26-turn designs with respect to signals with frequencies between 1 to 10 MHz, based on finite element analysis simulations. The conduction loss and filtering quality of device 300 may be based, at least in part, to the quality factor. As such, in some embodiments, various aspects of the inductor (e.g., copper thickness, via diameter, upper and lower conductor arrangements, number of turns) may be selected so as to maximize the quality factor.

FIG. 7 illustrates an inductance versus frequency graph 700, according to example embodiments. Namely, FIG. 7 illustrates the inductance of 8-turn, 13-turn, and 26-turn designs with respect to signals with frequencies between 1 to 10 MHz, based on finite element analysis simulations.

Under steady-state operation and assuming convection effects, a temperature rise of devices and systems described herein may be a result of power dissipated in the inductor. In example embodiments, the temperature rise may be approximated by:

$$\Delta T = P \times R_{th},$$

where P is the total dissipative power of the inductor and $R_{th}$ is the total thermal resistivity between the substrate and the environment. In another form, the dissipated power may be expressed as:

$$P = UA\Delta T,$$

where P is the total dissipative power of the inductor, U is the global thermal coefficient, and A is the global surface area for the PCB-embedded inductor. Accordingly, given a constant quality factor, either inductance or resistance (or both) may be reduced to decrease the amount of dissipative power. Normalizing by quality factor, the temperature rise of the PCB-embedded inductor may be expressed as:

$$\Delta T_{P,U} = P \times R_{th}/Q,$$

where $\Delta T_{P,U}$ is the temperature rise per quality factor increment.

The quality factor may be calculated based on the expression:

$$Q = \frac{\omega L}{R_{ac}} = \frac{2\pi f L}{R_{ac}} = \frac{k_1 2\pi f x N^2}{k_3 N^2 \sqrt{f}} = k_0 x \sqrt{f}.$$

Accordingly, the temperature rise may be expressed as:

$$\Delta T_{P,U} = \left(\frac{P}{UA}\right)/Q = k \frac{I^2 Z}{x^2 \times x \sqrt{f}} = k \frac{I^2 Z}{x^3 \sqrt{f}},$$

$$= k \frac{I^2 \sqrt{(2\pi f L)^2 + R_{ac}^2}}{x^3 \sqrt{f}} \propto k \frac{I^2 \sqrt{(2\pi f L)^2 + f}}{x^3 \sqrt{f}}, \text{ and}$$

$$= k_0 \frac{I^2 (\sqrt{f} + \alpha_0)}{x^3},$$

where x is the ratio of surface area to an effective length of the inductor, Z is the impedance, I is the root mean square current through the inductor, and Q is the quality factor of the inductor. $\Delta T_{P,U}$ is the temperature rise per unit of the quality factor of the inductor, $k_0$ is a constant based on the geometry of the device, and $\alpha_0$ is an AC resistance variation of the inductor. The variable x is defined as a degree of freedom for a design that includes an area of the inductor divided by an outer diameter of the inductor. A design with a larger value for x, which corresponds to a bigger surface area to diameter, may provide better heat transfer capability. However, a larger value for x may reduce power density and/or device efficiency.

Figure 8:
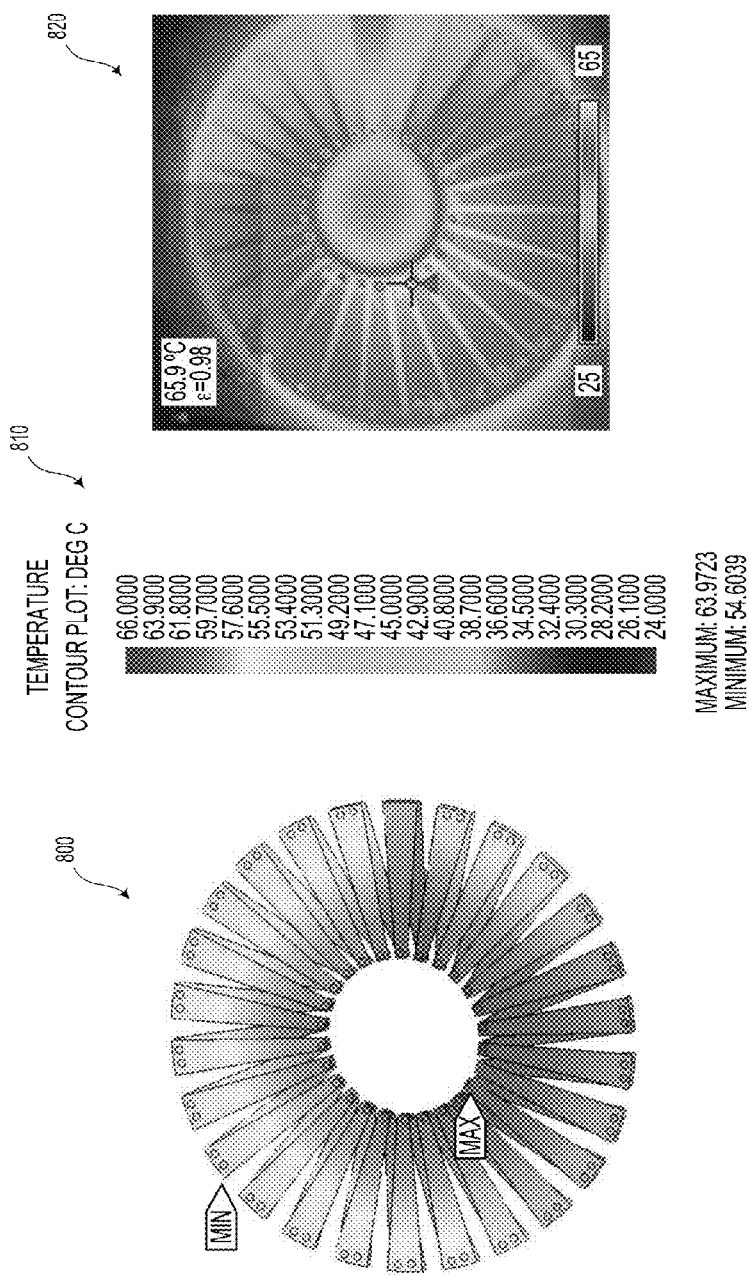
FIG. 8 illustrates a thermal model and a heat map, according to example embodiments.
Figure 9:
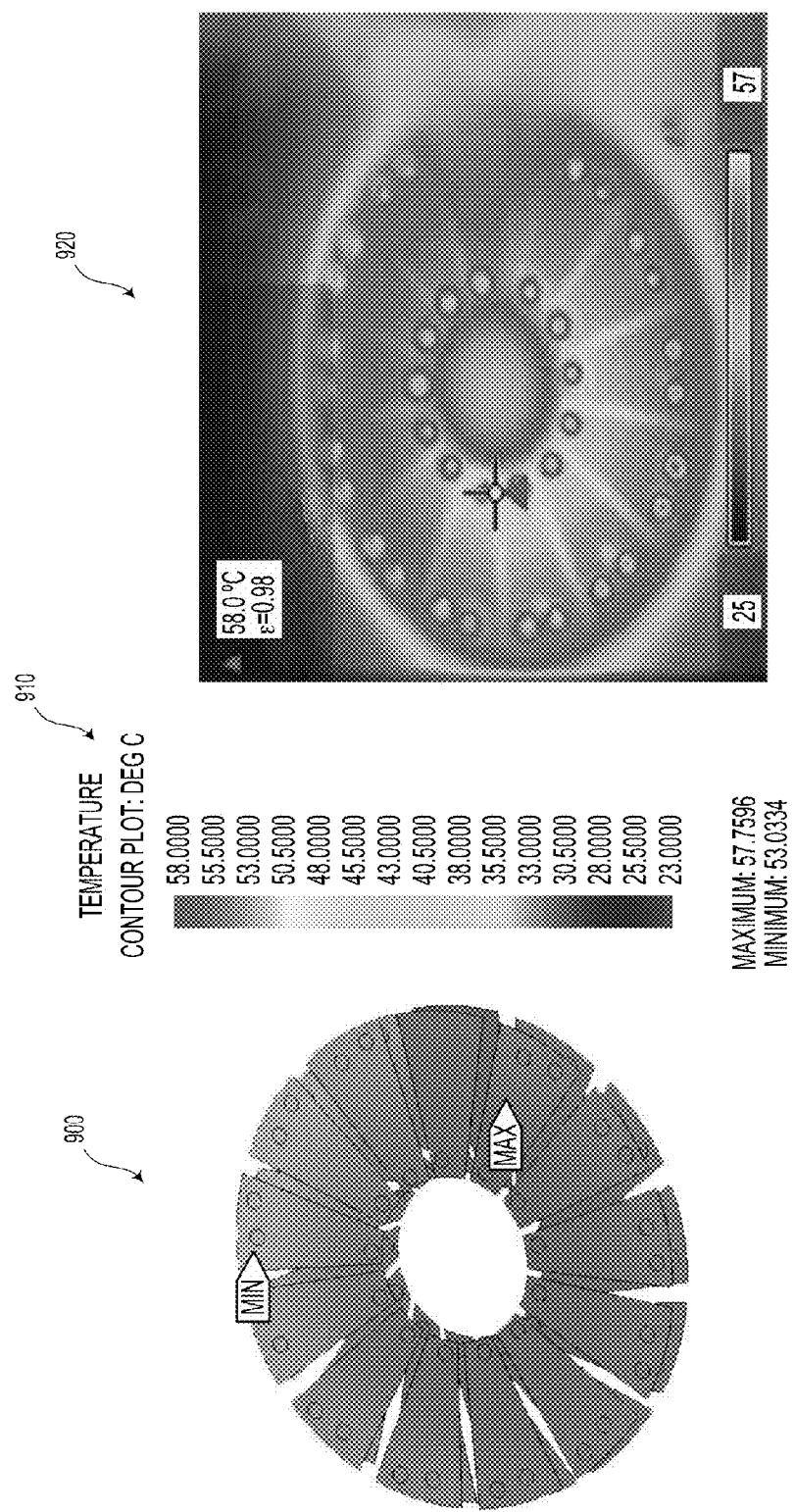
FIG. 9 illustrates a thermal model and a heat map, according to example embodiments.
Figure 10:
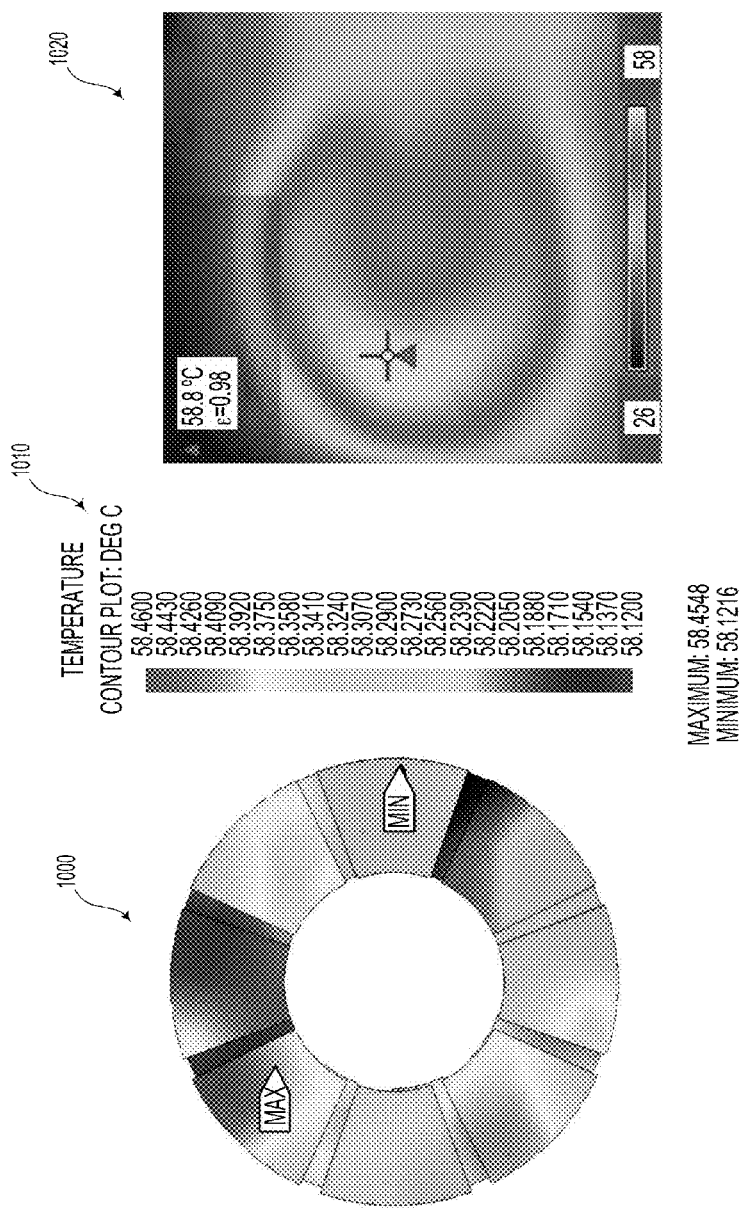
FIG. 10 illustrates a thermal model and a heat map, according to example embodiments.

FIGS. 8, 9, and 10 illustrate thermal models and actual temperature profiles of several example devices described herein. With the above-described design considerations, several different PCB-embedded inductors were simulated through using finite element methods in JMAG. That is, the thermal models 800, 900, and 1000 were determined, at least in part, by finite element analysis software. The thermal models 800, 900, and 1000 may be determined additionally or alternatively based on the equations described above. Among other information, the finite element simulations verified the predicted results for temperature distribution, current density, AC resistance, and inductance of the PCB-embedded inductor designs.

Furthermore, prototypes of each of the PCB-embedded designs were tested continuously under nominal current values (5 A for 26-turns, 10 A for 13-turn, and 18 A for 8-turn) for 20 minutes to reach the steady state conditions to extract the temperature rise profile (e.g., heat map 820, 920, and 1020).

FIG. 8 illustrates a thermal model 800, corresponding temperature index 810, and a heat map 820, according to example embodiments. Namely, FIG. 8 illustrates respective temperature profiles of simulation and experimental results of a 26-turn design. The design included an outer diameter of 60 mm, copper thickness of 35 μm, via diameter of 2 mm, inductance of 242 nH, a DC resistance of 160 mΩ, and an AC resistance at 5 MHz of 200 mΩ. The applied current was 5 A, and the ambient temperature was 23° C. Temperature rise experiments based on the 26-turn design showed temperature rise greater than 35° C. for 5 A applied continuous current.

FIG. 9 illustrates a thermal model 900, corresponding temperature index 910, and a heat map 920, according to example embodiments. Namely, FIG. 9 illustrates respective temperature profiles of simulation and experimental results of a 13-turn design. The design included an outer diameter of 60 mm, copper thickness of 35 µm, via diameter of 2 mm, inductance of 150 nH, a DC resistance of 32 mΩ, an AC resistance at 5 MHz of 50 mΩ. The applied current was 12 A, and the ambient temperature was 23° C. Temperature rise experiments based on the 13-turn design showed temperature rise greater than 40° C. for 12 A applied continuous current.

FIG. 10 illustrates a thermal model 1000, corresponding temperature index 1010, and a heat map 1020, according to example embodiments. Namely, FIG. 10 illustrates respective temperature profiles of simulation and experimental results of an 8-turn design. The design included an outer diameter of 30 mm, copper thickness of 144 µm, via diameter of 2.8 mm, inductance of 50 nH, a DC resistance of 2.4 mΩ, an AC resistance at 5 MHz of 8 mΩ. The applied current was 18 A, and the ambient temperature was 23° C.

Simulation and experimental results were utilized to verify other design choices. For example, simulations and experiments verified that the temperature reaches the highest point where the output leg is bent, and the current path is diverted in a different direction. Additionally, the highest attainable temperature is expected and verified in the 26-turn inductor design, which has higher conductive losses through the petals. The higher conductive losses result in the higher temperature rise.

III. Example Systems

Figure 11:
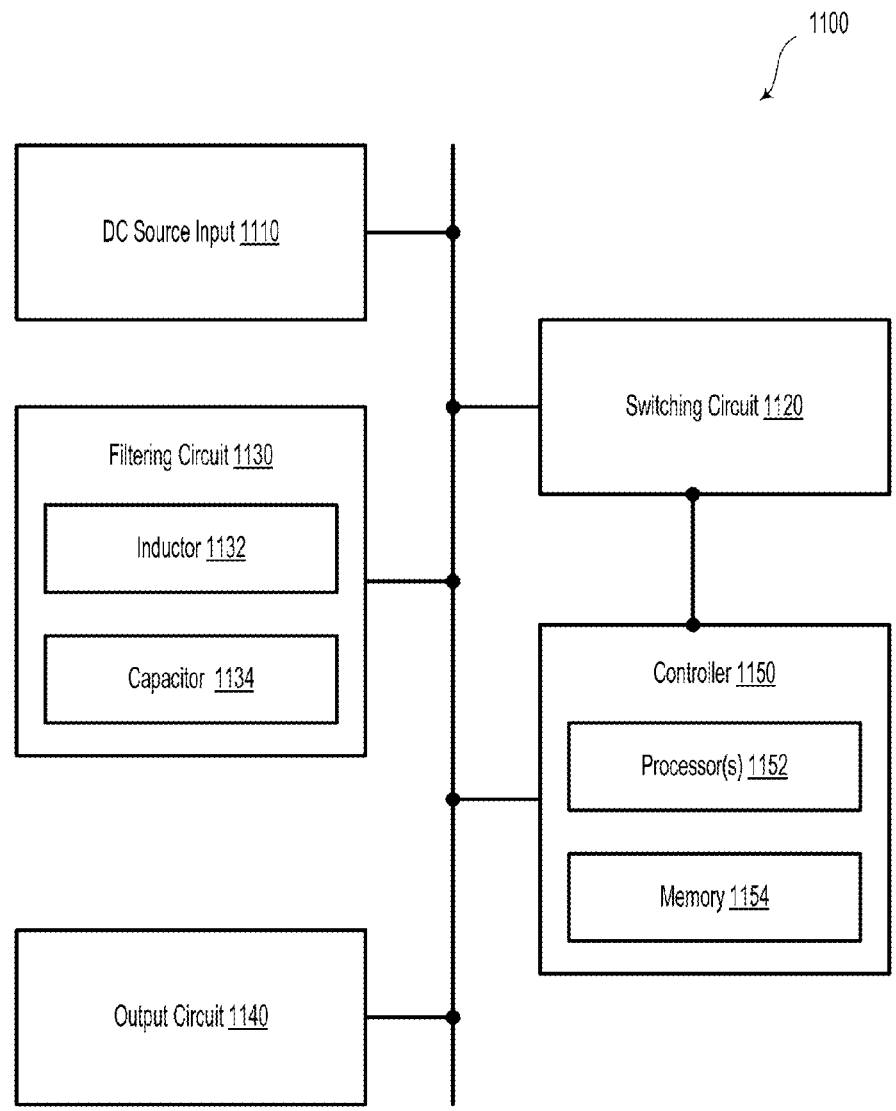
FIG. 11 illustrates a system, according to an example embodiment.

Inductor devices described herein may be incorporated into various systems. Such systems may include, for example, DC/AC inverter systems, switch mode power supplies (SMPSs), or hard switched inverters. FIG. 11 illustrates a system 1100, according to an example embodiment. System 1100 may include a DC source input 1110. In an example embodiment, an input current of the DC source input 1110 may be at least 17 Amperes. The DC source input 1110 may include other values of DC voltage and DC current.

The system 1100 includes a switching circuit 1120 coupled to the DC source input 1110. In an example embodiment, the switching circuit 1120 may include a gallium nitride (GaN) transistor-based half-bridge inverter. In such a scenario, a switching frequency of the switching circuit 1120 may be between about 1 MHz and 30 MHz. Other types of switching circuits and switching frequencies are contemplated. For example, full-bridge inverters, converters, other power circuits, and cascaded versions thereof are contemplated herein.

As an example, the switching circuit 1120 may include an Efficient Power Conversion EPC9033 development board. For example, the EPC9033 may include enhancement mode GaN field effect transistors (FETs) that may be operated in a half-bridge inverter mode. In some cases, the switching circuit 1120 may use a pulse-wave modulated (PWM) signal as an input signal for switching the DC voltage and current signal from the DC source input 1110.

The system 1100 also includes a filtering circuit 1130 coupled to the switching circuit 1120. In an example embodiment, the switching circuit 1120 provides a pulse-wave modulated (PWM) signal and/or a square wave signal to the filtering circuit 1130. That is, the switching circuit 1120 may switch a signal from the DC source input 1110 so as to provide a PWM signal or square wave signal based on the desired switching frequency.

In an example embodiment, the filtering circuit 1130 may be configured to filter out low frequency ripple currents and high frequency harmonics in signals provided by the switching circuit 1120. The filtering circuit 1130 includes an inductor 1132, and optionally, a capacitor. As provided elsewhere herein, the filtering circuit 1130 may include a parallel LC circuit with a resonant frequency that may be approximated by:

$$f_{cutoff} = \frac{1}{2\pi\sqrt{L_{min}C_{min}}} = \frac{1}{\sqrt{\frac{4\pi^2(V_{in}-V_{out})D_{max}}{\Delta I \times f_{sw}} \times \frac{\Delta I D_{max}}{f_{sw}\Delta V}}},$$

where $D_{max}$ is the maximum duty cycle of an input signal, $f_{sw}$ is the switching frequency of the switching circuit 1120, and $f_{cutoff}$ is the cutoff frequency of the AC filter. In some embodiments, $f_{cutoff}$ may be set to less than $\frac{1}{10} f_{sw}$. In such a scenario, the desired inductance value of inductor 1132 in the filtering circuit 1130 may be approximated by:

$$L = \frac{(V_{in}-V_{out})D_{max}^2}{\Delta V \times f_{sw}^2 \times C}.$$

The inductor 1132, which may be similar or identical to device 300 as illustrated and described in relation to FIG. 3A, includes a substrate having an upper surface and an opposing lower surface. The inductor also includes a plurality of upper conductors disposed along the upper surface of the substrate. The plurality of upper conductors is radially disposed about a central axis. Each upper conductor has a petal shape and a distance between adjacent upper conductors is less than a width of each upper conductor.

Furthermore, the inductor 1132 includes a plurality of lower conductors disposed along the lower surface. The plurality of lower conductors is radially disposed about the central axis. Each lower conductor has a petal shape and a distance between adjacent lower conductors is less than a width of each lower conductor.

The inductor 1132 further includes a plurality of through-substrate conductors connecting respective upper conductors to respective lower conductors so as to form a series electrical connection. The series electrical connection includes a toroid configuration.

The system 1100 further includes an output circuit 1140 coupled to the filtering circuit 1130. The output circuit 1140 may include an output amplifier and/or output contacts.

Optionally, the system 1100 may include a controller 1150. The controller 1150 includes at least one processor 1152 and a memory 1154. The at least one processor 1152 may carry out instructions stored in the memory 1154 so as to carry out operations. The operations may include, but are not limited to, causing the switching circuit 1120 to modulate a signal from the DC source input 1110 based on a desired switching frequency.

In an example embodiment, the desired switching frequency may be between 1-10 MHz. However, other switching frequencies are possible and contemplated herein.

Other operations are contemplated. Namely, the controller 1150 may be configured to control and/or adjust any or all of DC source input 1110, the filtering circuit 1130, or the output circuit 1140.

In an example embodiment, the system 1100 may be operated in a continuous conduction mode. That is, in such a scenario, a peak output voltage of the output circuit 1140 is at least 30 Volts and an output current of the output circuit 1140 may be at least 9 Amperes. It will be understood that other values for the peak output voltage and the output current of the output circuit 1140 are possible and contemplated herein.

While continuous conduction mode operation is described above, the system 1100 may be additionally or alternatively operated in a discontinuous conduction mode.

In an example embodiment, during operation of the system 1100, a temperature rise of the inductor 1132 may be no greater than about 45° C. While other temperature rise values are possible, the design of inductor 1132 may be selected so as to minimize temperature rise and/or heat distribution within the inductor 1132.

In some embodiments, a total harmonic distortion (THD) of the output circuit 1140 is less than about 10%. Namely, after filtering, the THD for the 8-turn design may be about 9.5%, the THD for the 13-turn design may be about 6.8%, and the THD for the 23-turn design may be about 5.8%. Other THD values are possible. Furthermore, various aspects of inductor 1132 and the filtering circuit 1130 may be selected based on the THD of system 1100 and output circuit 1140. Namely, the resonance frequency, frequency cutoff, or bandwidth of filtering circuit 1130 may be selected so as to minimize or reduce the THD of the output circuit 1140.

In some example embodiments, system 1100 may include one or more stages of a Si-based AC-stacked inverter. In some embodiments, the inductor 1132 may be a PCB-embedded inductor with a toroidal configuration. Such an inductor may operate at relatively high efficiency (e.g., more than 98%) at switching frequencies greater than 1 MHz. Assuming approximately 2-5% power loss for the switching circuit, including conduction and switching losses, the maximum allowable loss for the AC filter should generally be lower than 1-2% to achieve more than 95% overall efficiency for the inverter system. Under such conditions, system 1100 may have a rated power of 280 W. Specifically, the DC source input may be greater than 30 Volts with a 9 Amp input current. In such a scenario, the inverter output current may be 18 Amperes or more.

IV. Example Methods

Figure 12:
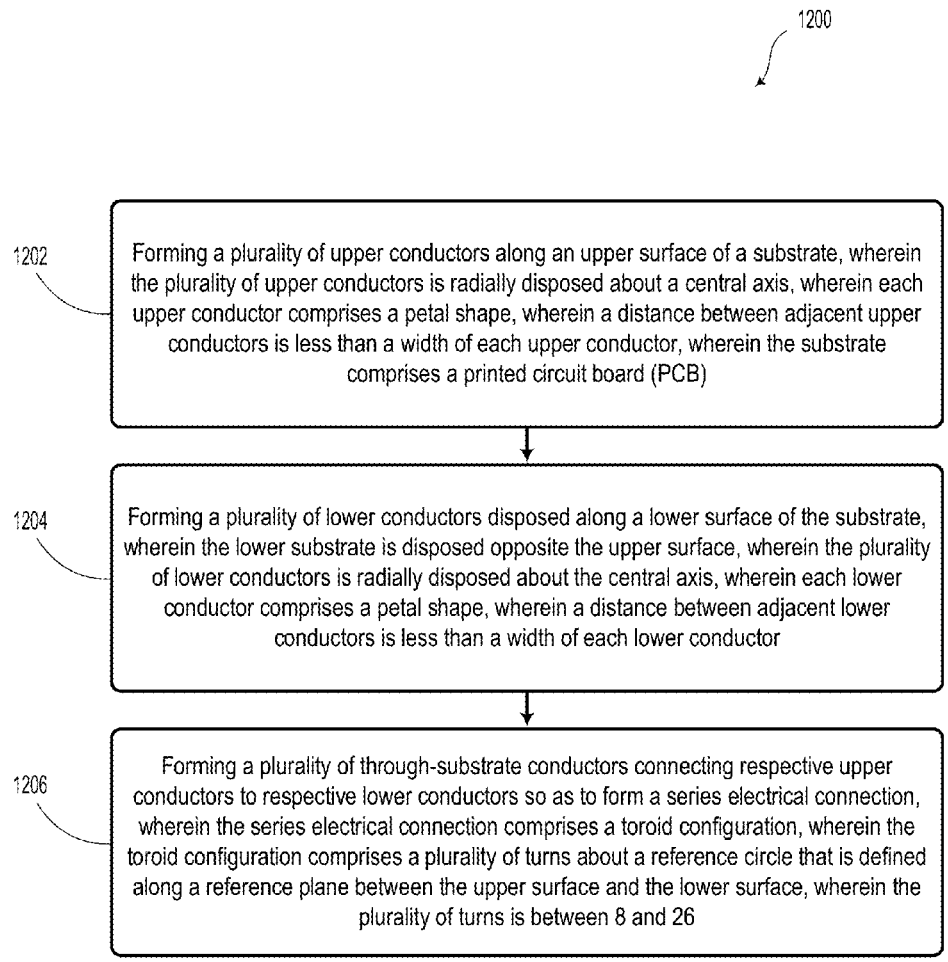
FIG. 12 illustrates a method of manufacture, according to an example embodiment.

FIG. 12 illustrates a method of manufacture 1200, according to an example embodiment. The method 1200 includes blocks that may be carried out in any order. Furthermore, various blocks may be added to or subtracted from method 1200 within the intended scope of this disclosure. The method 1200 may correspond to steps that may be carried out using any or all of the devices and systems illustrated and described in reference to FIG. 3, 4A, 4B, 4C, or 11. That is, as described herein, method of manufacture 1200 may relate to forming an inductor device, which may be an element in an inverter system.

Block 1202 includes forming a plurality of upper conductors along an upper surface of a substrate. As described elsewhere herein, the substrate may include a printed circuit board material, such as FR-4. In such a scenario, the plurality of upper conductors is radially disposed about a central axis. That is, the upper conductors may be disposed in a radial pattern about the central axis.

Each upper conductor may be formed in a petal shape (e.g., wider along an outer edge as compared to an inner edge. A distance between adjacent upper conductors may be less than a width of each upper conductor.

Block 1204 includes forming a plurality of lower conductors disposed along a lower surface of the substrate. The lower substrate is disposed opposite the upper surface. For example, the lower substrate may be a bottom surface of the FR-4 material and the upper surface may be a top surface of the FR-4. The plurality of lower conductors could be radially disposed about the central axis and each lower conductor could include a petal shape. In such a scenario, a distance between adjacent lower conductors is less than a width of each lower conductor.

In an example embodiment, forming the upper conductors and/or the lower conductors may include standard PCB processing techniques, such as exposing and developing a resist mask on the PCB and using electroless metal plating to form the copper conductors in the unmasked regions. Additionally or alternatively, the substrate may be patterned with other types of additive and/or subtractive techniques. For example, the conductors may be deposited using metal evaporation, electrolysis, or other electroplating methods. The conductors may be removed, at least in part, using etching and/or liftoff techniques. Other semiconductor manufacturing and PCB processing techniques to form the upper conductors and/or the lower conductors are contemplated herein.

Block 1206 includes forming a plurality of through-substrate conductors that connect respective upper conductors to respective lower conductors so as to form a series electrical connection. The series electrical connection may include a toroid configuration. In such a scenario, the toroid configuration may include a plurality of turns about a reference circle that is defined along a reference plane between the upper surface and the lower surface. For example, the plurality of turns may be between 8 and 26.

In some embodiments, forming the plurality of through-substrate conductors may include drilling or punching the substrate to form a via and then plating along the sidewalls of the via to create an electrical connection between the upper conductors and the lower conductors. In other embodiments, a conductive plug may be formed in the via. Other ways of electrically connecting the respective upper conductors with the respective lower conductor in a serial connection so as to form a toroidal configuration are contemplated herein.

Optionally, the method may include forming a heat sink that is coupled to at least one of the upper surface or the upper conductor. For example, the heat sink may include a plurality of cooling fins configured to remove heat from the inductor device. In some embodiments, the upper surface and the heat sink may be coated, at least in part, with a thermal paste or a thermal compound, which may have a high coefficient of thermal conductivity.

Figure 13:
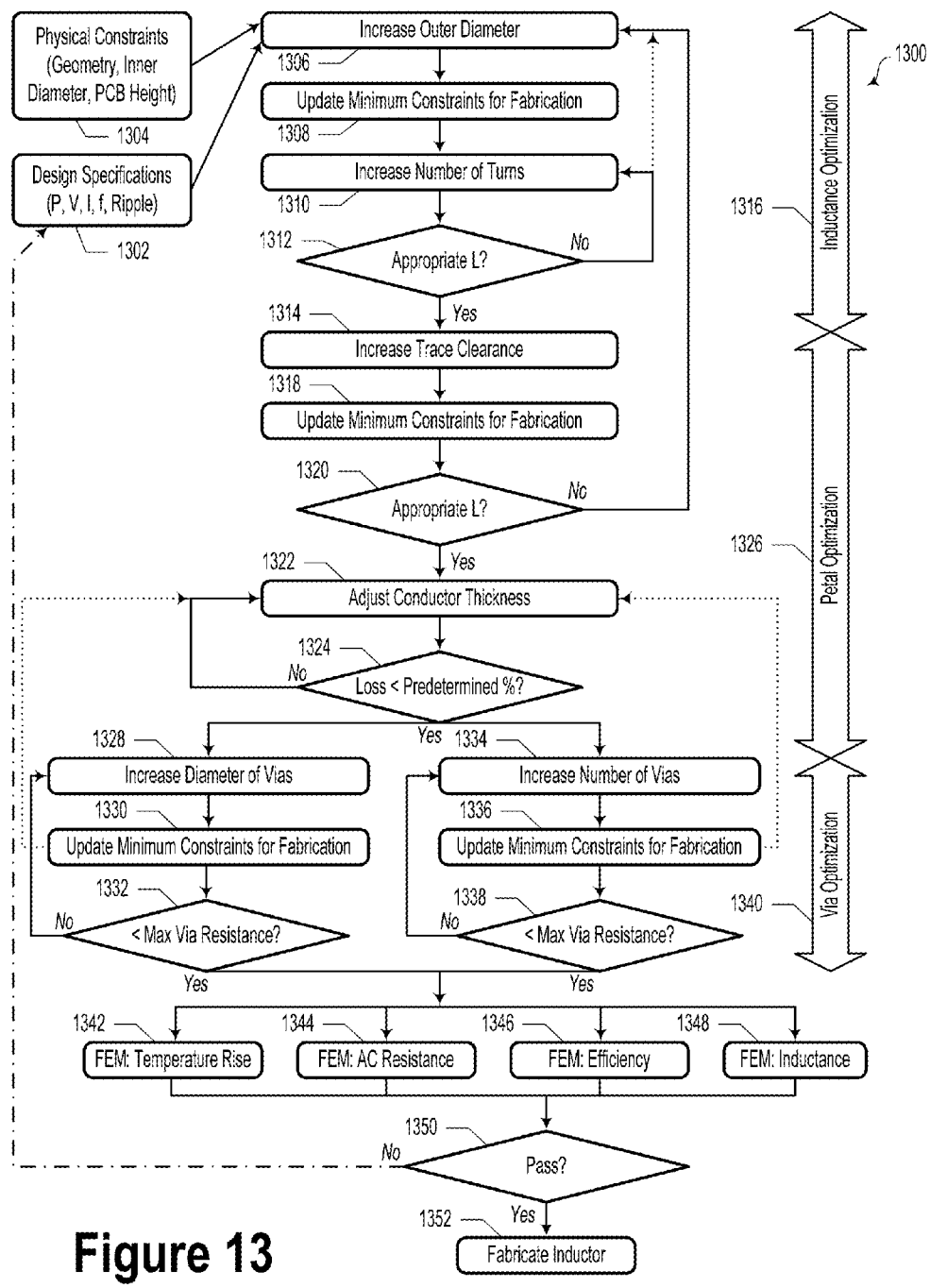
FIG. 13 illustrates a method, according to an example embodiment.

FIG. 13 illustrates a method 1300, according to an example embodiment. The method 1300 includes blocks that may be carried out in any order. Furthermore, various blocks may be added to or subtracted from method 1300 within the intended scope of this disclosure. The method 1300 may correspond to steps that may relate to the design and simulation of the devices and systems illustrated and described in reference to FIG. 3, 4A, 4B, 4C, or 11. That is, as described herein, method 1300 may relate to a design optimization of a PCB-embedded inductor device, which may be utilized in power electronic device filter. In some embodiments, method 1300 may provide design and optimization of a high power density inductor to maximize its efficiency when applied to inverter applications. In some embodiments, method 1300 may be conducted with one or more blocks of method 1200 as illustrated and described in reference to FIG. 12.

Method 1300 may represent a multi-objective algorithm that may help provide design solutions with regard to various design goals (e.g., device current, geometries, inductance, resistance, etc.). In example embodiments, method 1300 may include an iterative algorithm that includes 6 different levels (e.g., level-0 to level-5). Level-0 includes consideration of the electrical and geometrical design specifications and constraints.

Block 1302 includes determining and/or imposing certain design specifications for a desired inductor device. For example, the design specifications may include inductance value (e.g., 50-300 nH), maximum temperature rise, power efficiency, voltage, AC resistance, switching frequency, and the RMS current of the inductor. Such design specifications may be used initially, or throughout one or more blocks of method 1300.

Block 1304 includes determining and/or imposing certain physical constraints for the desired inductor device. As an example, the physical constraints may include a number of turns, an inner diameter, an outer diameter (e.g., not more than 60 mm), an overall device footprint, etc. In some embodiments, the inner diameter (e.g., 10 mm or 15 mm) and the outer diameter may be fixed (e.g., 30 or 60 mm). In such scenarios, the number of turns largely defines the inductance of the desired inductor device. Increasing the number of turns in the inductor device may provide better filtering characteristics and the inductance may scale as $L \propto N^2$. However, AC resistance and conduction loss will increase with an increased number of turns, which may lead to higher temperature rise and lower quality factor. As the inner diameter decreases, inductance increases. However, increasing the number of turns in the inductor also increases the device resistance, which may reduce efficiency of the device. Yet further, higher resistance increases the device temperature rise due to higher power dissipation in the inductor.

Block 1306 (level-1) includes increasing the outer diameter from an initial value (e.g., 10 mm).

Block 1308 includes updating the minimum fabrication constraints (e.g., substrate size, thickness, etc.) based on the outer diameter value from block 1306.

Block 1310 (level-2) includes increasing a number of turns from an initial value (e.g., 4 turns).

Block 1312 includes, for a given number of turns, evaluating whether the inductance of the device is within a given design criteria (e.g., inductance range between 50 and 300 nH). In such a scenario, designs within the design criteria may be nominated. The nominated designs and their respective design configuration information are passed along to subsequent method blocks.

Block 1314 (level-3) includes increasing or otherwise adjusting a trace clearance. The trace clearance may include a distance between adjacent conductors (e.g., petals). As an example, the trace clearance may be initially selected based on a breakdown voltage of air (e.g., 30 kV/cm). For instance, the initial trace clearance may be selected to be 1 mm. Subsequently, the clearance may be gradually increased to provide an optimized AC and/or DC resistance value of the inductor. In some embodiments, the AC resistance is proportional to trace clearance. That is, increasing the trace clearance increases the AC resistance.

In some embodiments, blocks 1306, 1308, 1310, and 1312 may be considered as an inductance optimization process 1316.

Block 1318 includes updating the minimum fabrication constraints (e.g., lithography needs, via diameter, conductor thickness) based on the trace clearance.

Block 1320 includes rechecking that the device inductance is still within the inductance range evaluated in block 1312 (e.g., 50-300 nH). If the device is not within the desired inductance range, the method 1300 may include reevaluating the outer diameter of the device (block 1306) and/or the number of turns (block 1310) so as to achieve the desired inductance value.

Block 1322 (level-4) includes adjusting the conductor thickness. For example, various thickness values of copper for the upper and lower conductor may be considered so as to provide a desired maximum amount of allowable current. For example, the maximum allowable current may be greater than 10 amps and/or greater than 18 amps. Other maximum allowable current values are possible.

Block 1324 includes determining whether device power loss is less than a predetermined value (e.g., 1%, 5%, 10%, or another value). In other words, block 1324 may include determining an efficiency of a given inductor design.

In some embodiments, blocks 1314, 1318, 1320, 1322, and 1324 may be blocks of a petal optimization process 1326.

Block 1328 (level-5a) includes increasing a via diameter so as to reduce a resistance of the inductor device. Block 1330 includes updating one or more fabrication constraints based on the via diameter selected. The fabrication constraints may include, for example, distance between adjacent vias, via position, and a number of vias per petal. Block 1332 includes determining whether the via resistance is less than a threshold via resistance amount (e.g., a maximum resistance per via). If the resistance is greater than the maximum via resistance, the method 1300 may return to block 1328 to increase the via diameter.

Block 1334 (level-5b) includes increasing a number of vias so as to reduce a resistance of the inductor device. Block 1336 includes updating fabrication constraints based on the number of vias selected. The fabrication constraints may include, for example, distance between adjacent vias, via position, and a number of vias per petal. Block 1338 includes determining whether the via resistance is less than a threshold via resistance amount (e.g., a maximum resistance per via). If the resistance is greater than the maximum via resistance, the method 1300 may return to block 1334 to increase the via diameter. In some embodiments, blocks 1328, 1330, 1332, 1334, 1336, and 1338 may be blocks in a via optimization process 1340.

If blocks 1332 and 1338 indicate that the resistance of the vias of a given inductor device design is less than the maximum via resistance, the inductor device design may be modeled using finite element analysis software (e.g., JMAG). Namely, temperature rise (block 1342), inductance (block 1348), AC resistance (block 1344), and efficiency (block 1346) may be simulated.

Figure 14:
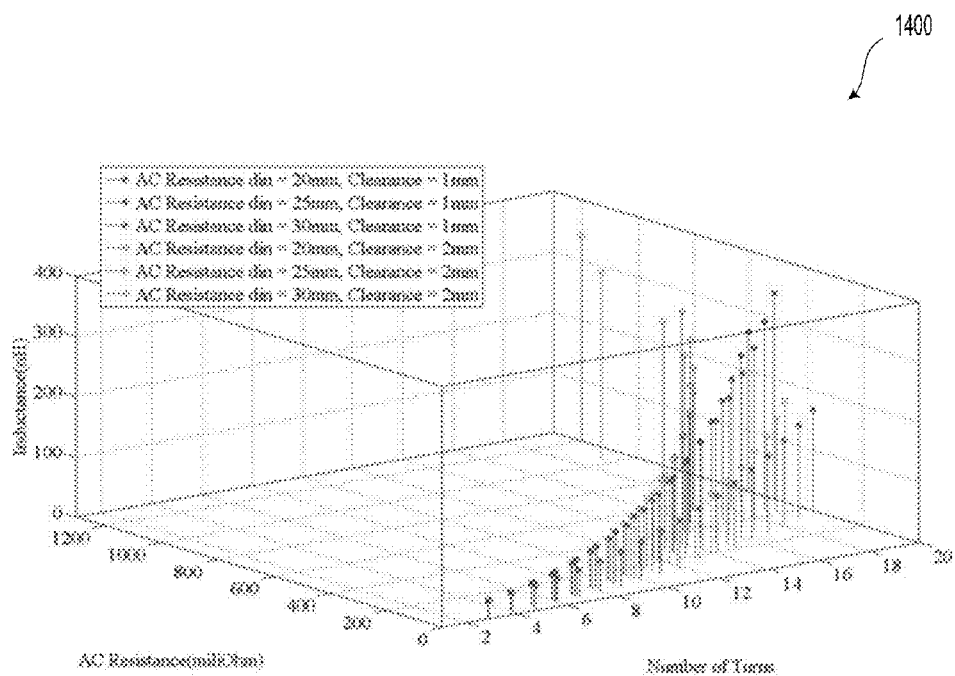
FIG. 14 illustrates a three-dimensional graph of inductance versus AC resistance and number of turns, according to an example embodiment.

Block 1350 is a determination of whether results of the finite element modeling analysis pass predetermined requirements for the inductor device. If the determination indicates that a given design did not pass the predetermined requirements, the method 1300 may return to a prior method step (e.g., block 1302). In other embodiments, the method 1300 may return to FIG. 14 illustrates a three-dimensional graph 1400 of inductance versus AC resistance and number of turns, according to an example embodiment. In particular, graph 1400 illustrates a multi-objective optimization of inductance and AC resistance versus the number of turns and various trace clearances of a PCB-embedded inductor with 4-oz copper on 2-layer PCB. The inner diameter is varied between 20 mm, 25 mm, and 30 mm.

Figure 15:
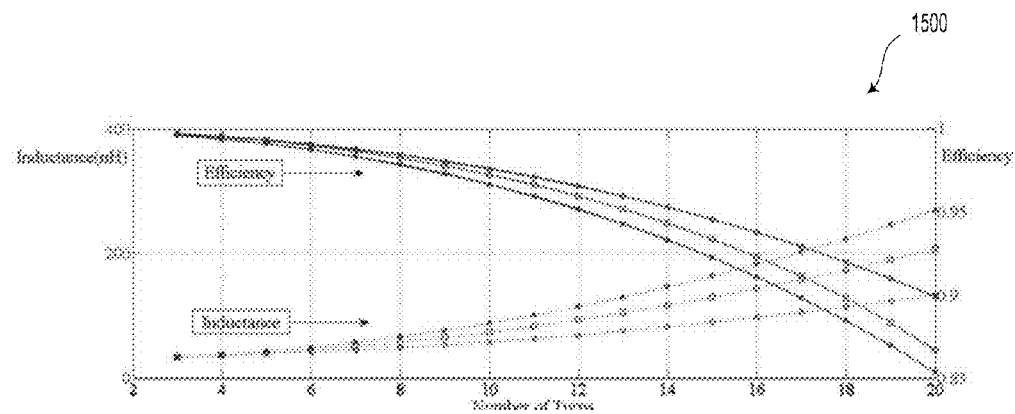
FIG. 15 illustrates a graph of inductance and efficiency versus number of turns, according to an example embodiment.

FIG. 15 illustrates a graph 1500 of inductance and efficiency versus number of turns, according to an example embodiment. Namely, graph 1500 illustrates example output from a multi-objective optimization of inductance and estimated efficiency versus the number of turns in a PCB-embedded inductor with 4-oz copper on a 2-layer PCB. The three different plots show various inner diameters of 15 mm (highest inductance, lowest efficiency), 25 mm, and 30 mm (lowest inductance, highest efficiency).

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. A device comprising:
a substrate having an upper surface and an opposing lower surface;
a plurality of upper conductors disposed along the upper surface, wherein the plurality of upper conductors is radially disposed about a central axis, wherein each upper conductor comprises a petal shape, wherein a distance between adjacent upper conductors is less than a width of each upper conductor;
a plurality of lower conductors disposed along the lower surface, wherein the plurality of lower conductors is radially disposed about the central axis, wherein each lower conductor comprises a petal shape, wherein a distance between adjacent lower conductors is less than a width of each lower conductor; and
a plurality of through-substrate conductors connecting respective upper conductors to respective lower conductors so as to form a series electrical connection, wherein the series electrical connection comprises a toroid configuration.

2. The device of claim 1, wherein the toroid configuration comprises a plurality of turns about a reference circle that is defined along a reference plane between the upper surface and the lower surface.

3. The device of claim 1, wherein a thickness of the substrate is less than about 1.6 millimeters.

4. The device of claim 1, wherein a diameter of the device is no greater than about 60 millimeters.

5. The device of claim 1, wherein an area of the device is less than about 3000 mm$^2$.

6. The device of claim 1, wherein the toroid configuration comprises a plurality of turns and the plurality of turns is at least one of 8, 13, or 26.

7. The device of claim 1, wherein an inductance of the device is between about 45 and 305 nanoHenries.

8. The device of claim 1, wherein a resistance of the device is less than about 2.6 milliOhms at DC and less than about 9 milliOhms at 1 MHz.

9. The device of claim 1, wherein a quality factor of the device is at least 300.

10. The device of claim 1, further comprising a heat sink coupled to at least one of the upper surface or one of the plurality of upper conductors.

11. A system comprising:
a direct current (DC) source input;
a switching circuit coupled to the DC source input;
a filtering circuit coupled to the switching circuit, wherein the filtering circuit comprises an inductor, the inductor comprising:
a substrate having an upper surface and an opposing lower surface;
a plurality of upper conductors disposed along the upper surface, wherein the plurality of upper conductors is radially disposed about a central axis, wherein each upper conductor comprises a petal shape, wherein a distance between adjacent upper conductors is less than a width of each upper conductor;
a plurality of lower conductors disposed along the lower surface, wherein the plurality of lower conductors is radially disposed about the central axis, wherein each lower conductor comprises a petal shape, wherein a distance between adjacent lower conductors is less than a width of each lower conductor; and
a plurality of through-substrate conductors connecting respective upper conductors to respective lower conductors so as to form a series electrical connection, wherein the series electrical connection comprises a toroid configuration; and
an output circuit coupled to the filtering circuit.

12. The system of claim 11, wherein an input current of the DC source input is at least 17 Amperes.

13. The system of claim 11, wherein the switching circuit comprises a GaN half-bridge inverter, and wherein a switching frequency of the switching circuit is between about 1 MHz and 30 MHz.

14. The system of claim 11, wherein the switching circuit provides a pulse-wave modulated (PWM) signal to the filtering circuit.

15. The system of claim 11, wherein the system is operated in a continuous conduction mode, wherein a peak output voltage of the output circuit is at least 30 Volts, and wherein an output current of the output circuit is at least 9 Amperes.

16. The system of claim 11, wherein the system is operated in a discontinuous conduction mode.

17. The system of claim 11, wherein, during operation of the system, a temperature rise of the inductor is no greater than about 45° C.

18. The system of claim 11, wherein a total harmonic distortion (THD) of the output circuit is less than about 10%.

19. A method for designing a PCB-embedded inductor, the method comprising:
  adjusting an outer diameter of the inductor and a number of turns of the inductor based on predetermined physical constraints and predetermined performance specifications, wherein the inductor comprises:
    a plurality of upper conductors disposed along an upper surface of a substrate, wherein the plurality of upper conductors is radial disposed about a central axis, wherein each upper conductor comprises a petal shape, wherein a trace clearance between adjacent upper conductors is less than a width of each upper conductor, wherein the substrate comprises a printed circuit board (PCB);
    a plurality of lower conductors disposed along a lower surface of the substrate, wherein the lower surface is disposed opposite the upper surface, wherein the plurality of lower conductors is radially disposed about the central axis, wherein each lower conductor comprises a petal shape, wherein a trace clearance between adjacent lower conductors is less than a width of each lower conductor; and
    a plurality of through-substrate conductors connect respective upper conductors to respective lower conductors so as to form a series electrical connection, wherein the series electrical connection comprises a toroid configuration, wherein the toroid configuration comprises a plurality of turns about a reference circle that is defined along a reference plane between the upper surface and the lower surface;
  subsequent to adjusting the outer diameter and the number of turns, determining whether an inductance of the inductor is greater than a threshold inductance value;
  adjusting a trace clearance, wherein the trace clearance comprises a distance between adjacent conductors;
  subsequent to adjusting the trace clearance, determining whether an inductance of the inductor is greater than a threshold inductance value;
  adjusting a thickness of at least one of the upper conductor or the lower conductor;
  adjusting a diameter of the through-substrate conductors;
  adjusting a number of through-substrate conductors;
  determining a plurality of device performance metrics, based on the adjusted attributes of the inductor;
  determining, based on the device performance metrics being above a plurality of device requirements, that the inductor should be fabricated; and
  fabricating the inductor according to the adjusted attributes.

20. The method of claim 19, wherein determining the plurality of device performance metrics comprises conducting at least one finite element analysis.

* * * * *